United States Patent
Hagiwara et al.

(10) Patent No.: US 9,748,360 B2
(45) Date of Patent: Aug. 29, 2017

(54) MANUFACTURING METHOD OF SEMICONDUCTOR DEVICE

(71) Applicant: RENESAS ELECTRONICS CORPORATION, Tokyo (JP)

(72) Inventors: Takuya Hagiwara, Tokyo (JP); Tetsuro Hanawa, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/833,502

(22) Filed: Aug. 24, 2015

(65) Prior Publication Data

US 2016/0064403 A1   Mar. 3, 2016

(30) Foreign Application Priority Data

Aug. 27, 2014   (JP) .................. 2014-173210

(51) Int. Cl.
*H01L 21/336* (2006.01)
*H01L 29/66* (2006.01)
(Continued)

(52) U.S. Cl.
CPC .... *H01L 29/66568* (2013.01); *H01L 21/0206* (2013.01); *H01L 21/0273* (2013.01); *H01L 21/3105* (2013.01); *H01L 21/31144* (2013.01); *H01L 21/324* (2013.01); *H01L 21/76224* (2013.01); *H01L 27/11573* (2013.01); (Continued)

(58) Field of Classification Search
CPC ........... H01L 21/0206; H01L 21/02164; H01L 21/0217; H01L 21/0275; H01L 21/28282; H01L 21/3065; H01L 21/3105; H01L 21/31055; H01L 21/31116; H01L 21/31144; H01L 21/324; H01L 21/76224; H01L 27/11573

See application file for complete search history.

(56) References Cited

U.S. PATENT DOCUMENTS 4,491,628 A   1/1985  Ito et al.
6,417,096 B1 *   7/2002  Chen ............... H01L 21/3105
257/E21.241
(Continued)

FOREIGN PATENT DOCUMENTS

JP   2-27660 B2   6/1990
JP   2011-29662 A   2/2011
WO   WO 2014063381 A1 *   5/2014   ........... H01L 29/665

*Primary Examiner* — John C Ingham
*Assistant Examiner* — Frederick B Hargrove
(74) *Attorney, Agent, or Firm* — McDermott Will & Emery LLP

(57) ABSTRACT

The present invention makes it possible to improve the reliability of a semiconductor device.

In a manufacturing method of a semiconductor device according to an embodiment, when a resist pattern is formed over a cap insulating film comprising a silicon nitride film, the resist pattern is formed through the processes of coating, exposure, and development treatment of a chemical amplification type resist. Then the chemical amplification type resist is applied so as to directly touch the surface of the cap insulating film comprising the silicon nitride film and organic acid pretreatment is applied to the surface of the cap insulating film comprising the silicon nitride film before the coating of the chemical amplification type resist.

14 Claims, 30 Drawing Sheets

(51) Int. Cl.
 *H01L 21/02* (2006.01)
 *H01L 21/3105* (2006.01)
 *H01L 27/11573* (2017.01)
 *H01L 21/311* (2006.01)
 *H01L 29/51* (2006.01)
 *H01L 21/762* (2006.01)
 *H01L 21/324* (2006.01)
 *H01L 21/027* (2006.01)
 *H01L 29/792* (2006.01)
 *H01L 21/28* (2006.01)
 *H01L 29/423* (2006.01)

(52) U.S. Cl.
 CPC .......... *H01L 29/513* (2013.01); *H01L 29/518* (2013.01); *H01L 29/66833* (2013.01); *H01L 29/792* (2013.01); *H01L 21/28282* (2013.01); *H01L 29/42344* (2013.01)

(56) References Cited

U.S. PATENT DOCUMENTS

| | | | |
|---|---|---|---|
| 2003/0170993 A1 | 9/2003 | Nagahara et al. | |
| 2006/0234454 A1* | 10/2006 | Yasui | H01L 21/28282 438/267 |
| 2006/0244037 A1* | 11/2006 | Kouketsu | H01L 27/105 257/314 |
| 2011/0121382 A1* | 5/2011 | Chakihara | G11C 16/0466 257/326 |
| 2012/0202156 A1* | 8/2012 | Yeh | G03F 7/40 430/319 |
| 2015/0295068 A1* | 10/2015 | Yin | H01L 29/665 438/285 |
| 2016/0064237 A1* | 3/2016 | Yang | H01L 21/3086 438/696 |

* cited by examiner

MANUFACTURING METHOD OF SEMICONDUCTOR DEVICE

CROSS-REFERENCE TO RELATED APPLICATIONS

The disclosure of Japanese Patent Application No. 2014-173210 filed on Aug. 27, 2014 including the specification, drawings and abstract is incorporated herein by reference in its entirety.

BACKGROUND

The present invention relates: to a manufacturing technology of a semiconductor device; and for example to a technology effectively applicable to a manufacturing technology of a semiconductor device having an electrically rewritable nonvolatile memory.

In Japanese Examined Patent Application Publication No. Hei2 (1990)-27660 (Patent Literature 1), a technology related to a light amplification type resist is described.

Further, in Japanese Unexamined Patent Application Publication No. 2011-29662 (Patent Literature 2), disclosed is a manufacturing method of a semiconductor device: having at least a first interlayer insulating film 6 and a second interlayer insulating film 4 comprising a low permittivity film over a substrate; and including the processes of forming a via hole 9 with a first resist pattern 1a formed over the second interlayer insulating film, applying organic stripping treatment by an organic stripping liquid containing an amine component, and thereafter forming a second resist pattern 1b over the second interlayer insulating film. Then it discloses that, before a second antireflection film 2b of a second resist pattern lower layer is applied after wet treatment, at least one of annealing treatment, plasma treatment, UV treatment, and organic solvent treatment is applied, the amine component hindering the catalytic action of acid generated in a resist during exposure is removed, and thus the resolution of the second resist pattern 1b is prevented from deteriorating.

CITATION LIST

Patent Literature

Patent Literature 1: Japanese Examined Patent Application Publication No. Hei2 (1990)-27660
Patent Literature 2: Japanese Unexamined Patent Application Publication No. 2011-29662

SUMMARY

As electrically writable/erasable nonvolatile semiconductor memory devices, an EEPROM (Electrically Erasable and Programmable Read Only Memory) and a flash memory are widely used. A nonvolatile semiconductor memory device (nonvolatile memory) typified by a currently widely used EEPROM or flash memory: has an electrically conductive floating gate electrode surrounded by a silicon oxide film and a charge accumulation film such as a trap insulating film under a gate electrode of a MOS (Metal Oxide Semiconductor) transistor; and stores information by using the fact that the threshold value of the transistor varies in accordance with a charge accumulation state at the floating gate electrode and the trap insulating film.

The trap insulating film means an insulating film having a trap level capable of accumulating an electric charge and a silicon nitride film or the like can be named as an example. A nonvolatile semiconductor memory device having a trap insulating film shifts the threshold value of a MOS transistor in accordance with the injection/emission of an electric charge to the trap insulating film and operates as a memory device. Such a nonvolatile semiconductor memory device having a trap insulating film as a charge accumulation film is called a MONOS (Metal Oxide Nitride Oxide Semiconductor) type transistor and is excellent in the reliability of data retention because an electric charge is accumulated in a discrete trap level in comparison with the case of using a conductive floating gate electrode as a charge accumulation film.

As an example of such a MONOS type transistor, there is a split gate type nonvolatile memory. In the split gate type nonvolatile memory, a memory transistor to store information is formed over a sidewall of a selection transistor to select a memory cell. Concretely, in a memory cell forming region, a control gate electrode and a cap insulating film are formed over a semiconductor substrate with a gate insulating film interposed and a memory gate electrode is formed over a sidewall of the control gate electrode and the cap insulating film with a laminated insulating film including a charge accumulation film interposed and, in a peripheral circuit forming region, a gate electrode of a MISFET is formed with a gate insulating film interposed.

In a manufacturing method of a semiconductor device having such a split gate type nonvolatile memory, a laminated film of a polysilicon film and a cap insulating film is deposited over a semiconductor substrate, the laminated film is patterned in a memory cell forming region, and thereby a control gate electrode is formed. Successively, a resist pattern to cover the memory cell forming region and expose a peripheral circuit forming region is formed, and the cap insulating film in the peripheral circuit forming region is removed. Successively, a laminated insulating film including a charge accumulation film and a memory gate electrode are formed over the sidewall of the control gate electrode, thereafter the polysilicon film in the peripheral circuit forming region is patterned, and a gate electrode of a MISFET is formed in the peripheral circuit forming region.

A resist pattern to cover a memory cell forming region and expose a peripheral circuit forming region is formed through the processes of coating, exposure, and development of a chemical amplification type resist but it has been recognized that a resist residue, a nuclear defect, or a nuclear swelling defect, those being described later, is generated over a polysilicon film in the peripheral circuit forming region. Then a recognized problem has been that, in a peripheral circuit forming region, because a polysilicon film under a nuclear defect or a nuclear swelling defect remains at the patterning process of the polysilicon film, short circuit occurs between gate electrodes in a plurality of MISFETs in the peripheral circuit forming region, and the reliability of a semiconductor device deteriorates.

Other problems and novel features will be obvious from the descriptions and attached drawings in the present specification.

In a manufacturing method of a semiconductor device according to an embodiment, when a resist pattern is formed over a cap insulating film comprising a silicon nitride film, the resist pattern is formed through the processes of coating, exposure, and development of a chemical amplification type resist. Then the chemical amplification type resist is a substance formed by being applied directly to the surface of the cap insulating film comprising the silicon nitride film so as to touch the surface of the cap insulating film and applying organic acid pretreatment to the surface of the cap insulating film comprising the silicon nitride film before the coating of the chemical amplification type resist.

According to an embodiment, it is possible to improve the reliability of a semiconductor device.

DETAILED DESCRIPTION

In the following embodiments, if necessary for convenience sake, each of the embodiments is explained by dividing it into plural sections or embodiments but, unless otherwise specified, they are not unrelated to each other and are in the relationship of one being a modified example, a detail, a supplemental explanation, or the like of a part or the whole of another.

Further in the following embodiments, when the number of elements and others (including the number of pieces, a numerical value, a quantity, a range, and others) are referred to, except the cases of being specified and being limited obviously to a specific number in principle and other cases, the number is not limited to a specific number and may be larger or smaller than the specific number.

Furthermore in the following embodiments, it goes without saying that the constituent components (including a component step and others) are not necessarily essential except the cases of being specified and being obviously thought to be essential in principle and other cases.

Likewise in the following embodiments, when a shape, positional relationship, and the like of a constituent component or the like are referred to, they substantially include those approximate or similar to the shape and the like except the cases of being specified and being obviously thought to be otherwise in principle and other cases. The same goes for the numerical value and the range.

Further, in all the drawings for explaining the embodiments, an identical member is represented with an identical code in principle and is not explained repeatedly. Here, hatching may sometimes be used even in a plan view in order to make a drawing easy to understand.

First Embodiment

Layout Configuration Example of Semiconductor Chip

Figure 1:
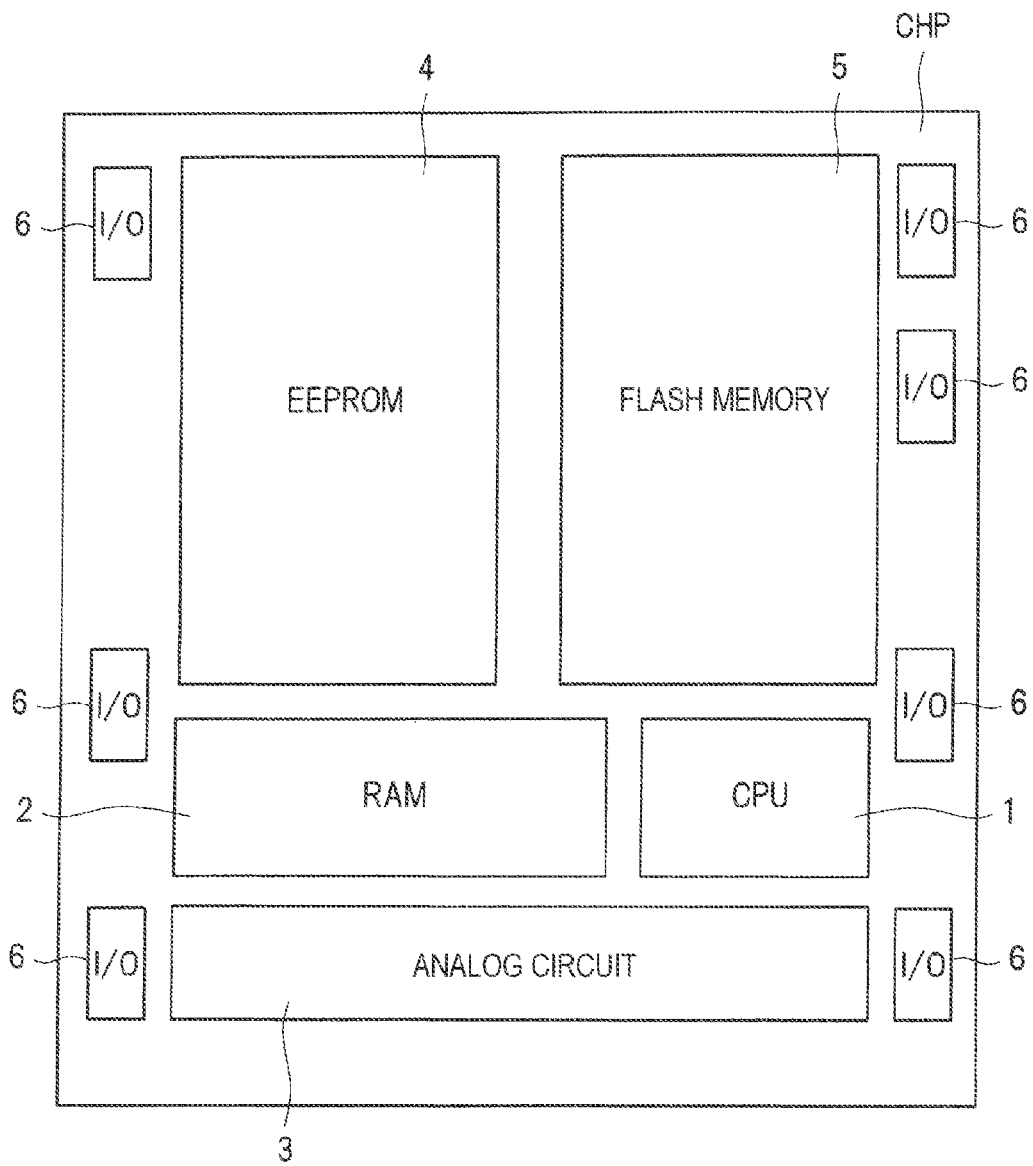
FIG. 1 is a view showing a layout configuration example of a semiconductor chip according to First Embodiment.

A semiconductor device having a nonvolatile memory according to First Embodiment is explained in reference to drawings. Firstly, a layout configuration of a semiconductor device (semiconductor chip) in which a system including a nonvolatile memory is formed is explained. FIG. 1 is a view showing a layout configuration example of a semiconductor chip CHP according to First Embodiment. In FIG. 1, the semiconductor chip CHP has a CPU (Central Processing Unit) 1, a RAM (Random Access Memory) 2, an analog circuit 3, an EEPROM (Electrically Erasable Programmable Read Only Memory) 4, a flash memory 5, and I/O (Input/Output) circuits 6 and constitutes a semiconductor integrated circuit device.

The CPU (circuit) 1 is also called a central processing unit and corresponds to the heart of a computer or the like. The CPU 1 reads out and decodes an instruction from a memory and carries out various calculation and control on the basis of the instruction.

The RAM (circuit) 2 is a memory capable of reading out memory information randomly, namely memory information stored occasionally, and newly writing memory information and is also called a random access memory. As a RAM for an IC memory, there are two types, a DRAM (Dynamic RAM) that uses a dynamic circuit and an SRAM (Static RAM) that uses a static circuit. The DRAM is a random access memory requiring memory retention operation and the SRAM is a random access memory not requiring memory retention operation.

The analog circuit 3 is a circuit that handles temporally continuously changing voltage and current signals, namely analog signals, and comprises an amplification circuit, a conversion circuit, a modulation circuit, an oscillation circuit, a power source circuit, and others for example.

Each of the EEPROM 4 and the flash memory 5 is a kind of a nonvolatile memory electrically rewritable in both writing operation and erasing operation and is also called an electrically erasable programmable read only memory. The memory cell of each of the EEPROM 4 and the flash memory 5 comprises, for example, a MONOS (Metal Oxide Nitride Oxide Semiconductor) type transistor or an MNOS (Metal Nitride Oxide Semiconductor) type transistor, those being for a memory. In the writing operation and erasing operation of each of the EEPROM 4 and the flash memory 5, a Fowler-Nordheim type tunneling phenomenon is used for example. Here, it is also possible to perform writing operation and erasing operation by using hot electrons or hot holes. The difference between the EEPROM 4 and the flash memory 5 is that, whereas the EEPROM 4 is a nonvolatile memory that is erasable by a byte for example, the flash memory 5 is a nonvolatile memory that is erasable by a word line for example. Generally a program and the like for carrying out various processes at the CPU 1 are stored in the flash memory 5. In contrast, various data that are frequently rewritten are stored in the EEPROM 4.

Each of the I/O circuits 6 is: an input/output circuit; and is a circuit for outputting data from the interior of the semiconductor chip CHP to a device coupled to the exterior of the semiconductor chip CHP and inputting data from a device coupled to the exterior of the semiconductor chip CHP to the interior of the semiconductor chip CHP.

<Device Structure of Semiconductor Device>

Figure 2:
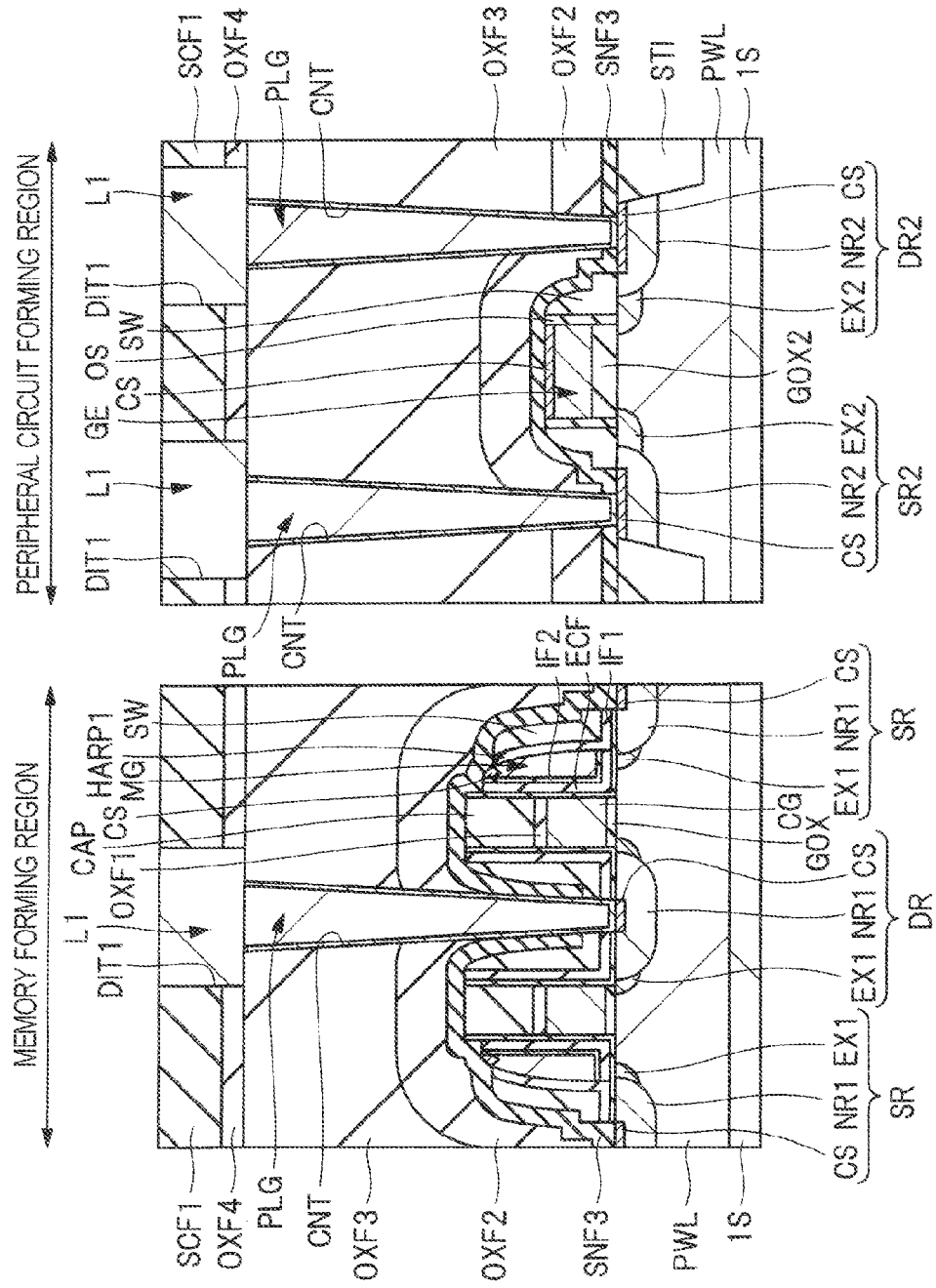
FIG. 2 is a view explaining a device structure example of a semiconductor device according to First Embodiment.

FIG. 2 is a view explaining a device structure example of a semiconductor device according to First Embodiment. In FIG. 2, the device structure of a nonvolatile memory formed in a memory cell forming region and the device structure of a high withstand voltage MISFET (Metal Insulator Semiconductor Field Effect Transistor) formed in a peripheral circuit forming region are shown.

The semiconductor device according to First Embodiment is formed in the semiconductor chip CHP shown in FIG. 1 and the nonvolatile memory formed in the memory cell forming region of FIG. 2 is a memory constituting the EEPROM 4 or the flash memory 5, those being shown in FIG. 1, for example. Meanwhile, the high withstand voltage MISFET formed in the peripheral circuit forming region of FIG. 2 is a MISFET constituting the analog circuit 3 or each of the I/O circuits 6, those being shown in FIG. 1, or a MISFET included in a peripheral circuit to drive and control a nonvolatile memory for example.

Here, in the semiconductor device according to First Embodiment, in addition to the nonvolatile memory and the high withstand voltage MISFET, a low withstand voltage MISFET having a withstand voltage lower than the high withstand voltage MISFET is also formed but is not explained here in consideration of the points that the essential structure of the low withstand voltage MISFET is the same as the essential structure of the high withstand voltage MISFET and is not the specific feature in First Embodiment. For example, the low withstand voltage MISFET is a MISFET constituting the CPU 1, the RAM 2, or the like or a MISFET contained in a peripheral circuit to drive and control the nonvolatile memory, those being shown in FIG. 1.

Further, although explanations are made on the basis of an n-channel type MISFET in First Embodiment, it is also possible to form a p-channel type MISFET. The device structure of a p-channel type MISFET is not explained here in consideration of the points that basically the p-channel type MISFET has a device structure formed by reversing the electrically conductive type of the constituent components (semiconductor region and others) of an n-channel type MISFET and is not the specific feature in First Embodiment.

Firstly, in FIG. 2, the configuration of a nonvolatile memory formed in a memory cell forming region is explained. In the device structure of a nonvolatile memory shown in FIG. 2, two memory cells arranged symmetrically to a drain region DR are shown. Here, the device structures of the two memory cells are the same and hence the device structure of a nonvolatile memory is explained while attention is focused on the memory cell arranged on the right side for example.

As shown in FIG. 2, a p-type well PWL is formed over a semiconductor substrate 1S. Then a memory cell is formed over the p-type well PWL. The memory cell comprises a selection section to select a memory cell and a storage section to store information.

Firstly, the configuration of the selection section to select a memory cell is explained. The memory cell has a gate insulating film GOX formed over the semiconductor substrate 1S (p-type well PWL) and a control gate electrode (control electrode) CG is formed over the gate insulating film GOX. Further, in the memory cell according to First Embodiment, a cap insulating film CAP is formed over the control gate electrode CG with a silicon oxide film OXF1 interposed.

The gate insulating film GOX comprises a silicon oxide film for example and the control gate electrode CG comprises a polysilicon film that is a conductive film for example. The cap insulating film CAP comprises a silicon nitride film for example.

The control gate electrode CG has the function to select a memory cell. That is, a specific memory cell is selected by the control gate electrode CG and writing operation, erasing operation, or reading operation is applied to the selected memory cell.

Successively, the configuration of the storage section of the memory cell is explained. A memory gate electrode MG is formed over a sidewall on one side (sidewall on right side) of a laminated structure comprising the gate insulating film GOX, the control gate electrode CG, the silicon oxide film OXF1, and the cap insulating film CAP with a laminated insulating film interposed. The memory gate electrode MG has the shape of a sidewall formed over the sidewall on the one side of the laminated structure and comprises a polysilicon film and a silicide film CS formed over the polysilicon film. The silicide film CS is formed in order to lower the resistance of the memory gate electrode MG, and comprises a nickel platinum silicide film (NiPtSi film) for example, but is not limited to that, and can also comprise a cobalt silicide film or a nickel silicide film.

A laminated insulating film having a first part formed between the sidewall on the one side of the laminated structure and the memory gate electrode MG and a second part formed between the memory gate electrode MG and the semiconductor substrate 1S is formed. The first part of the laminated insulating film comprises an insulating film IF1 touching the control gate electrode CG, an insulating film IF2 touching the memory gate electrode MG, and a charge accumulation film ECF interposed between the insulating film IF1 and the insulating film IF2. Further, the second part of the laminated insulating film comprises the insulating film IF1 formed over the semiconductor substrate 1S, the insulating film IF2 formed at the lower layer of the memory gate electrode MG, and the charge accumulation film ECF interposed between the insulating film IF1 and the insulating film IF2. That is, both the first part and the second part of the laminated insulating film comprise the insulating films IF1 and IF2 and the charge accumulation film ECF, respectively.

The insulating films IF1 comprises an insulating film such as a silicon oxide film or a silicon oxynitride film for example and functions as a gate insulating film formed between the memory gate electrode MG and the semiconductor substrate 1S. The insulating film IF1 comprising the silicon oxide film also has the function as a tunnel insulating film. For example, the storage section of the memory cell stores or erases information by injecting electrons into the charge accumulation film ECF or injecting positive holes into the charge accumulation film ECF from the semiconductor substrate 1S through the insulating film IF1 and hence the insulating film IF1 also functions as a tunnel insulating film.

Then the charge accumulation film ECF formed over the insulating film IF1 has the function of accumulating an electric charge. Concretely, in First Embodiment, the charge accumulation film ECF comprises a silicon nitride film. The storage section of the memory cell according to First Embodiment stores information by controlling the electric current flowing in the semiconductor substrate 1S under the memory gate electrode MG in accordance with the existence or nonexistence of an electric charge accumulated in the charge accumulation film ECF. That is, information is stored by using the fact that the threshold voltage of the electric current flowing in the semiconductor substrate 1S under the memory gate electrode MG changes in accordance with the existence or nonexistence of an electric charge accumulated in the charge accumulation film ECF.

In First Embodiment, an insulating film having a trap level is used as the charge accumulation film ECF. As an example of the insulating film having a trap level, a silicon nitride film is named but it is not limited to the silicon nitride film and a high permittivity film having a permittivity higher than the silicon nitride film, such as an aluminum oxide (alumina) film, a hafnium oxide film, or a tantalum oxide film, may also be used for example. Otherwise, the charge accumulation film ECF may comprise a silicon nano-dot. When an insulating film having a trap level is used as the charge accumulation film ECF, an electric charge is trapped in the trap level formed in the insulating film. In this way, an electric charge is accumulated in the insulating film by trapping the electric charge in the trap level.

A polysilicon film has heretofore been mainly used as the charge accumulation film ECF. When a polysilicon film is used as the charge accumulation film ECF, if a part of the insulating film IF1 or the insulating film IF2 surrounding the charge accumulation film ECF is defective, because the charge accumulation film ECF is a conductive film, it may sometimes happen that all of the electric charge accumulated in the charge accumulation film ECF may go away by abnormal leakage.

To cope with that, a silicon nitride film that is an insulator has been increasingly used as the charge accumulation film ECF. On this occasion, the electric charge contributing to data storage is accumulated in a discrete trap level existing in the silicon nitride film. Consequently, even when a defect is developed in any part of the insulating film IF1 or the insulating film IF2, those surrounding the charge accumulation film ECF, an electric charge is accumulated in a discrete trap level of the charge accumulation film ECF and hence not all the electric charge goes away. As a result, it is possible to try to improve the reliability of data retention.

For the reason, it is possible to improve the reliability of data retention by using not only a silicon nitride film but also such a film as to include a discrete trap level as the charge accumulation film ECF. Further, in First Embodiment, a silicon nitride film excellent in data retention property is used as the charge accumulation film ECF. As a result, it is possible to reduce the film thicknesses of the insulating film IF1 and the insulating film IF2 formed for preventing an electric charge from flowing out from the charge accumulation film ECF. It also means that there is the advantage that the voltage to drive a memory cell can be lowered in First Embodiment.

Further, the insulating film IF2 is an insulating film for securing insulation properties between the charge accumulation film ECF and the memory gate electrode MG. The insulating film IF2 comprises an insulating film such as a silicon oxide film or silicon oxynitride film for example. This therefore means that the insulating film IF1 and the insulating film IF2 comprise the same kind of films. Both the insulating film IF1 and the insulating film IF2 can comprise a silicon oxide film for example.

Successively, among the sidewalls of the laminated structure, the memory gate electrode MG is formed on one side (right side) and a sidewall SW is formed on the other side (left side) with the insulating film IF1 and a silicon oxide film HARP1 interposed. Likewise, among the sidewalls of the memory gate electrode MG, the laminated structure is formed on one side (left side) with the laminated insulating film interposed and a sidewall SW is formed on the other side (right side) with the silicon oxide film HARP1 interposed.

A pair of shallow low concentration impurity diffusion regions EX1 that are n-type semiconductor regions are formed in the semiconductor substrate 1S right under the sidewalls SW and a pair of deep high concentration impurity diffusion regions NR1 are formed in outside regions touching the paired shallow low concentration impurity diffusion regions EX1. The deep high concentration impurity diffusion regions NR1 are also n-type semiconductor regions and a silicide film CS is formed over the surfaces of the deep high concentration impurity diffusion regions NR1. A source region SR and a drain region DR of a memory cell are formed by the paired shallow low concentration impurity diffusion regions EX1 and the paired deep high concentration impurity diffusion regions NR1.

The source region SR and the drain region DR can take an LDD (Lightly Doped Drain) structure by forming the source region SR and the drain region DR by the shallow low concentration impurity diffusion regions EX1 and the deep high concentration impurity diffusion regions NR1.

Here, a transistor comprising the gate insulating film GOX, the control gate electrode CG formed over the gate insulating film GOX, the source region SR, and the drain region DR is called a selection transistor. Meanwhile, a transistor comprising the laminated insulating film comprising the insulating film IF1, the charge accumulation film ECF, and the insulating film IF2, the memory gate electrode MG formed over the laminated insulating film, the source region SR, and the drain region DR is called a memory transistor. As a result, it can be said that the selection section of the memory cell comprises the selection transistor and the storage section of the memory cell comprises the memory transistor. In this way, the memory cell is configured.

Successively, a wiring structure to be coupled to the memory cell is explained. In FIG. 2, a silicon nitride film SNF3 is formed over the memory cell so as to cover the memory cell, a silicon oxide film (ozone TEOS film) OXF2 is formed over the silicon nitride film SNF3, and a silicon oxide film (TEOS film) OXF3 is formed over the silicon oxide film OXF2.

Here, in the present specification, the silicon nitride film SNF3, the silicon oxide film OXF2, and the silicon oxide film OXF3 are combined and called a contact interlayer insulating film.

In the contact interlayer insulating film, a contact hole CNT penetrating the contact interlayer insulating film and reaching the silicide layer CS constituting the drain region DR is formed. Here, although it is not shown in FIG. 2, a contact hole reaching the silicide film CS constituting the source region SR is also formed in the contact interlayer insulating film.

In the interior of the contact hole CNT, a titanium/titanium nitride film that is a barrier conductive film is formed and a tungsten film is formed so as to fill the contact hole CNT. By embedding the titanium/titanium nitride film and the tungsten film into the contact hole CNT in this way, an electrically conductive plug PLG is formed. Then an interlayer insulating film comprising a silicon oxide film OXF4 and an SiOC film SCF1 is formed over the contact interlayer insulating film and a wiring gutter DIT1 is formed in the interlayer insulating film for example. A wire L1 is formed so as to fill the wiring gutter DIT1. The wire L1 comprises a laminated film of a tantalum/tantalum nitride film and a copper film and is electrically coupled to the plug PLG formed in the contact interlayer insulating film for example.

Successively, the configuration of a MISFET formed in the peripheral circuit forming region is explained in reference to FIG. 2. The peripheral circuit forming region indicates a region where a peripheral circuit is formed. Concretely, a nonvolatile memory (nonvolatile semiconductor memory device) comprises a memory cell forming region where memory cells are formed in an array (in a matrix) and a peripheral circuit forming region where a peripheral circuit to control the memory cells formed in the memory cell forming region is formed. Then the peripheral circuit formed in the peripheral circuit forming region comprises a word driver to control a voltage applied to a control gate electrode CG in a memory cell and the like, a sense amplifier to amplify an output from a memory cell, a control circuit to control the word driver and the sense amplifier (including a booster circuit), and others. In the peripheral circuit forming region shown in FIG. 2 therefore, a MISFET constituting the word driver, the sense amplifier, the control circuit (including a booster circuit), or the like is shown for example. In First Embodiment, explanations are made particularly on the basis of a high withstand voltage MISFET among MISFETs.

As shown in FIG. 2, in the peripheral circuit forming region, a p-type well PWL is formed over a semiconductor substrate 1S. The p-type well PWL comprises a p-type semiconductor region formed by introducing p-type impurities such as boron (B) into the semiconductor substrate 1S.

Successively, a gate insulating film GOX2 is formed over the p-type well PWL (semiconductor substrate 1S) and a gate electrode GE is formed over the gate insulating film GOX2. The gate insulating film GOX2 comprises a silicon oxide film for example and the gate electrode GE comprises a polysilicon film and a silicide film CS formed over the surface of the polysilicon film for example. Into the polysilicon film constituting the gate electrode GE, n-type impurities such as phosphorus are introduced in order to inhibit the gate electrode GE from being depleted for example. The silicide film CS constituting a part of the gate electrode GE is formed for lowering the resistance of the gate electrode GE.

Over sidewalls on both the sides of the gate electrode GE, sidewalls SW are formed and shallow low concentration impurity diffusion regions EX2 are formed in the semiconductor substrate 1S (p-type well PWL) right under the sidewalls SW for example. The shallow low concentration impurity diffusion regions EX2 are n-type semiconductor regions and are formed in conformity to the gate electrode GE. Then deep high concentration impurity diffusion regions NR2 are formed outside the shallow low concentration impurity diffusion regions EX2. The deep high concentration impurity diffusion regions NR2 are also n-type semiconductor regions and are formed in conformity to the sidewalls SW. A silicide film CS for lowering resistance is formed over the surfaces of the deep high concentration impurity diffusion regions NR2. A source region SR comprises the shallow low concentration impurity diffusion region EX2 and the deep high concentration impurity diffusion region NR2 and a drain region DR2 comprises the shallow low concentration impurity diffusion region EX2 and the deep high concentration impurity diffusion region NR2. In this way, the high withstand voltage MISFET is formed in the peripheral circuit forming region.

Here, in the peripheral circuit forming region, a p-channel type MISFET is also formed and the configuration of the p-channel type MISFET is obtained by reversing the electrically conductive type of a semiconductor region constituting an n-channel type MISFET.

Successively, a wiring structure to couple to the high withstand voltage MISFET formed in the peripheral circuit forming region is explained. A contact interlayer insulating film comprising a silicon nitride film SNF3, a silicon oxide film (ozone TEOS film) OXF2, and a silicon oxide film (TEOF film) OXF3 is formed over the high withstand voltage MISFET so as to cover the high withstand voltage MISFET.

In the contact interlayer insulating film, contact holes CNT penetrating the contact interlayer insulating film and reaching the silicide film CS constituting the source region SR2 and the drain region DR2 are formed. In the interior of each of the contact holes CNT, a titanium/titanium nitride film that is a barrier conductive film is formed and a tungsten film is formed so as to fill the contact hole CNT. In this way, an electrically conductive plug PLG is formed by embedding a titanium/titanium nitride film and a tungsten film into each of the contact holes CNT. Then an interlayer insulating film comprising a silicon oxide film OXF4 and an SiOC film SCF1 is formed over the contact interlayer insulating film and wiring gutters DIT1 are formed in the interlayer insulating film for example. Then wires L1 are formed so as to fill the wiring gutters DIT1. Each of the wires L1 comprises a laminated film of a tantalum/tantalum nitride film and a copper film and is electrically coupled to each of the plugs PLG formed in the contact interlayer insulating film for example.

<Manufacturing Method of Semiconductor Device>

Figure 3:
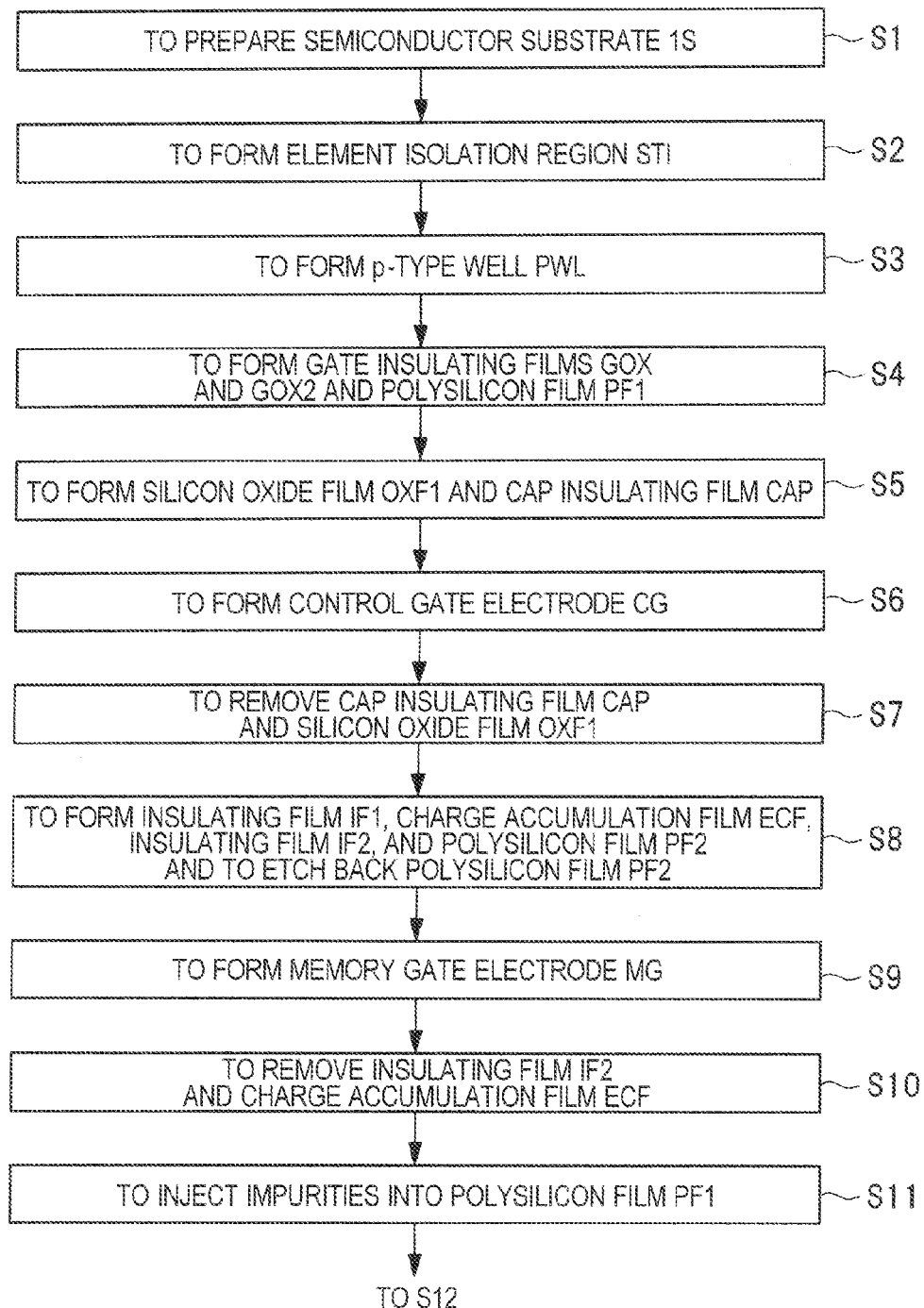
FIG. 3 is a process flow diagram showing a part of a manufacturing process of a semiconductor device according to First Embodiment.
Figure 4:
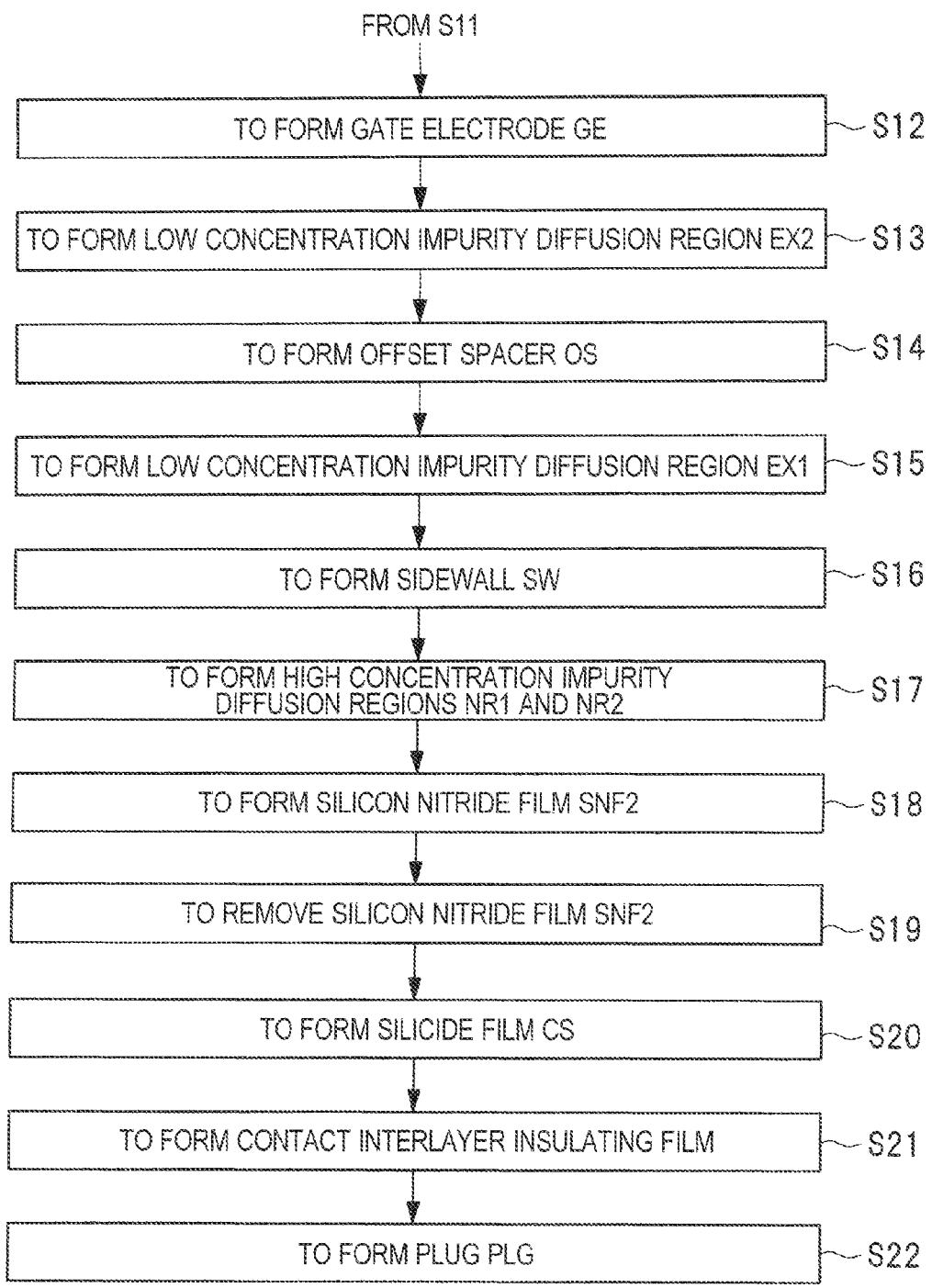
FIG. 4 is a process flow diagram showing a part of the manufacturing process of the semiconductor device according to First Embodiment.

A semiconductor device according to First Embodiment is configured as stated above and a manufacturing method of a semiconductor device according to First Embodiment is hereunder explained in reference to drawings. FIGS. 3 and 4 are process flow diagrams showing parts of a manufacturing process of a semiconductor device according to First Embodiment. FIGS. 5 to 22 are sectional views of a semiconductor device during manufacturing processes according to First Embodiment.

Figure 5:
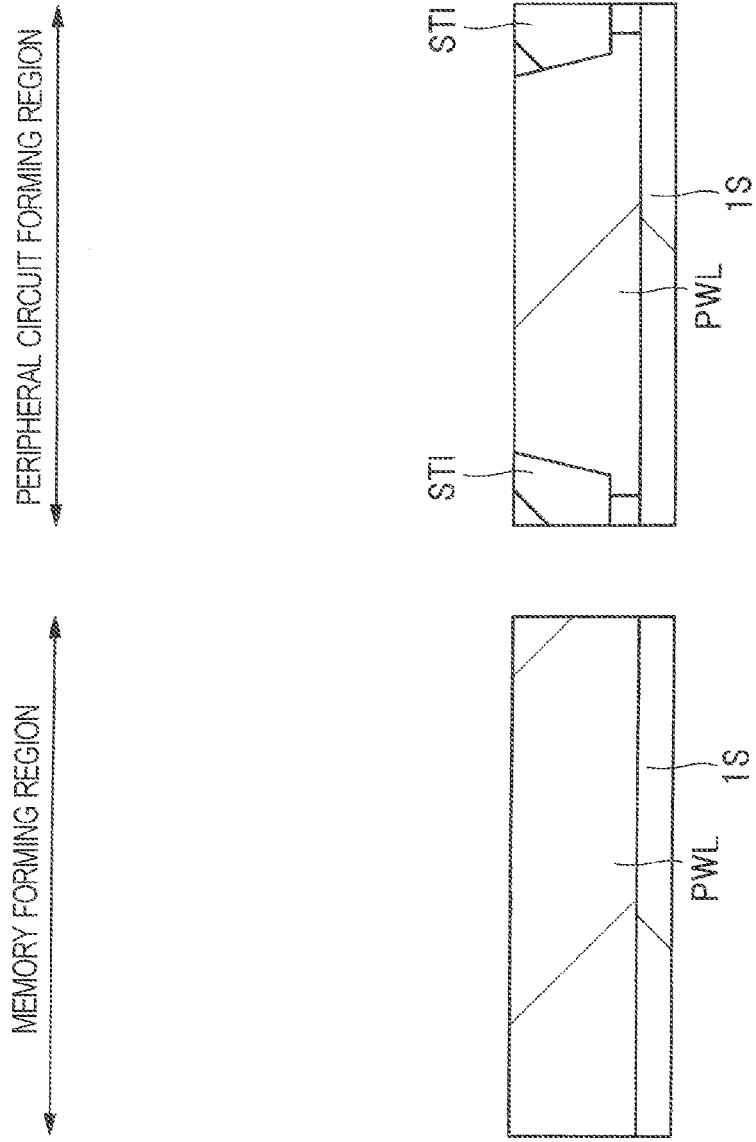
FIG. 5 is a sectional view of a semiconductor device during a manufacturing process according to First Embodiment.

Firstly, FIG. 5 shows a p-type well PWL forming process (Step S3 in FIG. 3). Firstly, a semiconductor substrate 1S comprising silicon monocrystal into which p-type impurities such as boron are introduced is prepared (Step S1 in FIG. 3). On this occasion, the semiconductor substrate 1S is in the state of a nearly disc-shaped semiconductor wafer. That is, a plurality of semiconductor devices arranged in a matrix are elaborated in the semiconductor wafer. Then an element isolation film STI is formed in the semiconductor substrate 1S (Step S2 in FIG. 3). The element isolation film STI is formed so that elements may not interfere with each other. The element isolation film STI can be formed by an STI (Shallow Trench Isolation) method for example. In the STI method, the element isolation film STI is formed as follows. That is, an element isolation trench is formed in the semiconductor substrate 1S by a photolithography technology and an etching technology. Then an insulating film (silicon oxide film or the like) is formed over the semiconductor substrate 1S so as to fill the element isolation trench and successively the unnecessary silicon oxide film formed over the semiconductor substrate 1S is removed by a chemical mechanical polishing (CMP) method. As a result, it is possible to form the element isolation film STI having the insulating film (silicon oxide film or the like) embedded only into the element isolation trench. Here in FIG. 5, the element isolation film STI is formed in the peripheral circuit forming region. Meanwhile, in the memory cell forming region in FIG. 5, an element isolation film STI seems to be not formed but practically an element isolation film STI is formed in the direction perpendicular to the sheet plane of FIG. 2 for example.

Successively, by introducing impurities into the semiconductor substrate 1S, a p-type well PWL is formed in the memory cell forming region and a p-type well PWL is formed in the peripheral circuit forming region. The p-type well PWL is formed by introducing p-type impurities such as boron into the semiconductor substrate 1S by an ion implantation method for example. Here actually, the impurity concentration and others are usually different between the p-type well PWL formed in the memory cell forming region and the p-type well PWL formed in the peripheral circuit forming region but in the present specification they are described as the p-type well PWL representing an identical code for simplicity.

Then in order to adjust the threshold voltage of a high withstand voltage MISFET, electrically conductive type impurities are introduced into a channel region of the semiconductor substrate 1S by an ion implantation method if necessary for example.

Figure 6:
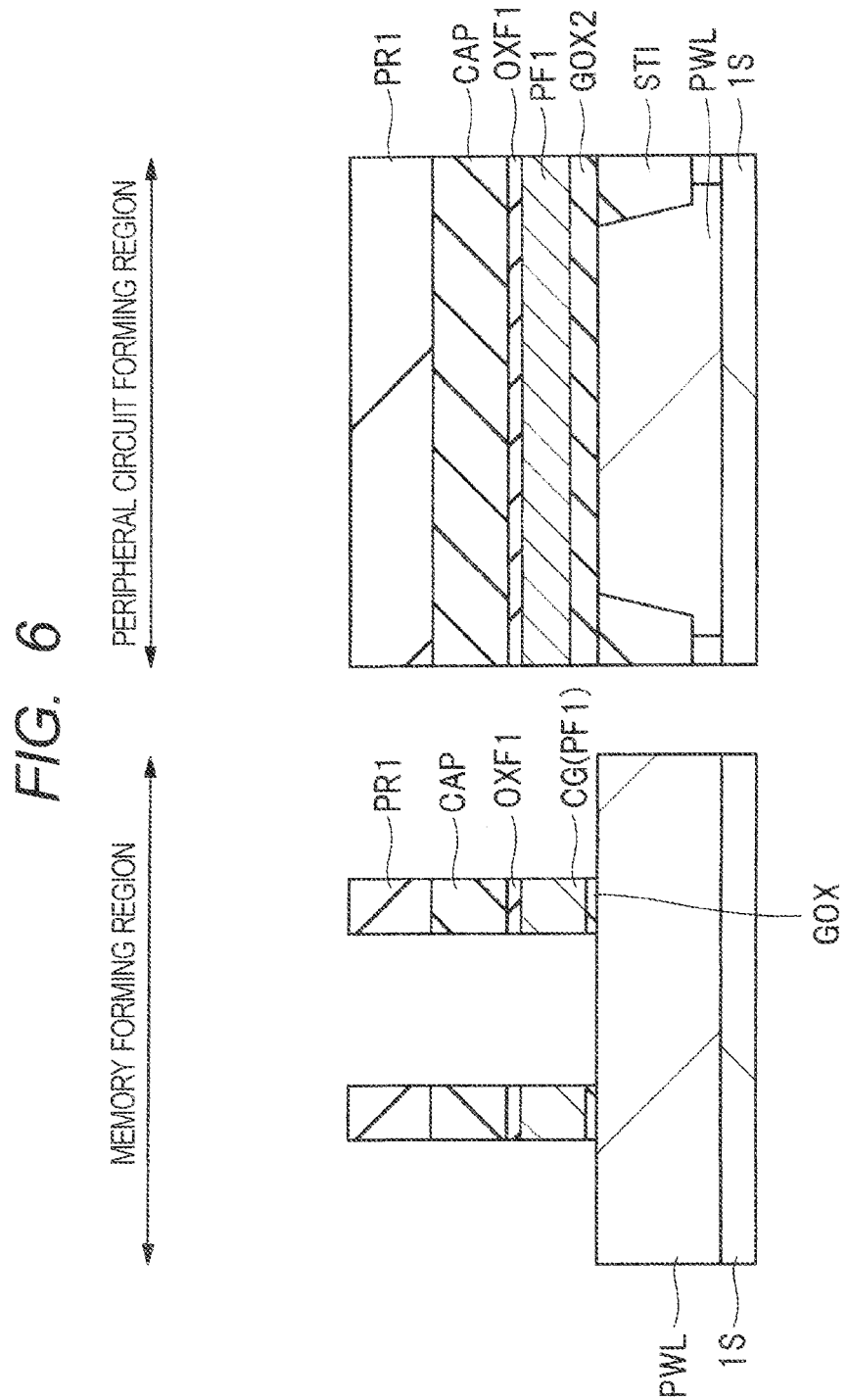
FIG. 6 is a sectional view of the semiconductor device during a manufacturing process succeeding to FIG. 5.

Successively, FIG. 6 shows a process of forming a gate insulating film GOX, a gate insulating film GOX2, and a polysilicon film PF1 (Step S4 in FIG. 3), a process of forming a silicon oxide film OXF1 and a cap insulating film CAP (Step S5 in FIG. 3), and a process of forming a control gate electrode CG (Step S6 in FIG. 3). Firstly, the surface of the semiconductor substrate 1S is cleaned by a dilute hydrofluoric acid or the like (DHF cleaning that will be described later) and thereafter a gate insulating film GOX2 of a high withstand voltage MISFET formed in the peripheral circuit forming region is formed over the semiconductor substrate 1S. The gate insulating film GOX2 comprises a silicon oxide film and the film thickness is about 15 nm for example. Then the gate insulating film GOX2 formed in the memory cell forming region is removed by a photolithography technology and an etching technology. Successively, a gate insulating film GOX is formed in the memory cell forming region over the semiconductor substrate 1S.

The gate insulating film GOX comprises an insulating film such as a silicon oxide film for example and can be formed by a thermal oxidation method for example. Here, the gate insulating film GOX is not limited to a silicon oxide film and is variously changeable and the gate insulating film GOX may also comprise a silicon oxynitride (SiON) film for example. That is, a structure formed by segregating nitrogen at the interface between the gate insulating film GOX and the semiconductor substrate 1S may also be adopted. The silicon oxynitride film has significant effects of inhibiting an interface level from developing in the film and reducing electron trap in comparison with a silicon oxide film. It is therefore possible to improve the hot carrier tolerance of the gate insulating film GOX and improve insulation properties. Further, the silicon oxynitride film is more unlikely to let impurities through than a silicon oxide film. As a result, it is possible to inhibit a threshold voltage caused by the diffusion of impurities in the gate electrode on the side of the semiconductor substrate 1S from varying by using the silicon oxynitride film as the gate insulating film GOX. The silicon oxynitride film may be formed by applying heat treatment to the semiconductor substrate 1S in an atmosphere containing nitrogen such as NO, $NO_2$, or $NH_3$ for example. Otherwise, a similar effect can be obtained by forming the gate insulating film GOX comprising a silicon oxide film over the surface of the semiconductor substrate 1S, thereafter applying heat treatment to the semiconductor substrate 1S in an atmosphere containing nitrogen, and segregating nitrogen at the interface between the gate insulating film GOX and the semiconductor substrate 1S. Further, it is also possible to form a silicon oxynitride film by a plasma nitriding method. On this occasion, nitrogen is segregated at the interface between the gate electrode (control gate electrode) and the gate insulating film GOX and NBTI (Negative Bias Temperature Instability) can be improved.

Further, the gate insulating film GOX may also comprise a high permittivity film having a permittivity higher than the silicon oxide film for example. A silicon oxide film has heretofore been used as the gate insulating film GOX from the viewpoints of high insulation properties and excellent electrical and physical stability of a silicon/silicon oxide interface. In accordance with the miniaturization of an element however, the film thickness of the gate insulating film GOX is increasingly required to be smaller. If such a thin silicon oxide film is used as the gate insulating film GOX, electrons flowing in a channel tunnel a barrier formed by the silicon oxide film and flow into a gate electrode, namely a tunnel current is generated, undesirably.

To cope with that, a high permittivity film that can increase a physical film thickness even when the capacity is not changed has been used by using a material of a permittivity higher than a silicon oxide film. By a high permittivity film, it is possible to increase the physical film thickness even when the capacity is not changed and hence reduce leak current. In particular, a silicon nitride film is a film having a permittivity higher than a silicon oxide film but it is desirable to use a high permittivity film having a permittivity higher than a silicon nitride film.

As a high permittivity film having a permittivity higher than a silicon nitride film, a hafnium oxide film ($HfO_2$ film) that is one of hafnium oxides is used for example. In place of a hafnium oxide film, it is also possible to use another hafnium-system insulating film such as an HfAlO film (hafnium aluminate film), an HfON film (hafnium oxynitride film), an HfSiO film (hafnium silicate film), or an HfSiON film (hafnium silicon oxynitride film). Further, it is also possible to use a hafnium-system insulating film into which an oxide such as a tantalum oxide, a niobium oxide, a titanium oxide, a zirconium oxide, a lanthanum oxide, or an yttrium oxide is introduced. A hafnium-system insulating film, similarly to a hafnium oxide film, has a permittivity higher than a silicon oxide film or a silicon oxynitride film and hence can obtain effects similar to the case of using a hafnium oxide film.

Successively, a polysilicon film (polycrystal silicon film) PF1 is formed over the whole principal surface of the semiconductor substrate 1S. Then phosphorus (P) or arsenic (As) that is an n-type impurity is introduced into the polysilicon film PF1 formed in the memory cell forming region by an ion implantation method. Successively, a silicon oxide film OXF1 is formed over the polysilicon film PF1 and a cap insulating film CAP is formed over the silicon oxide film OXF1 (Step S5 in FIG. 3). The cap insulating film CAP can comprise a silicon nitride film for example.

Successively, after a resist film (resist mask) PR1 is formed over the cap insulating film CAP, the resist film PR1 is patterned by a photolithography technology. Then in the memory cell forming region, the cap insulating film CAP, the silicon oxide film OXF1, the polysilicon film PF1, and the gate insulating film GOX are patterned in sequence by anisotropic dry etching with the patterned resist film PR1 used as a mask (Step S6 in FIG. 3). As a result, as shown in FIG. 6, in the memory cell forming region, a laminated structure comprising the gate insulating film GOX, a control gate electrode CG, the silicon oxide film OXF1, and the cap insulating film CAP is formed. Meanwhile, over the whole surface of the peripheral circuit forming region, the gate insulating film GOX2, the polysilicon film PF1, the silicon oxide film OXF1, and the cap insulating film CAP remain.

Successively, the patterned resist film PR1 is removed and electrically conductive type impurities are introduced into the channel region of the semiconductor substrate 1S by an ion implantation method if necessary for example in order to adjust the threshold voltage of the memory transistor in the memory cell.

Figure 7:
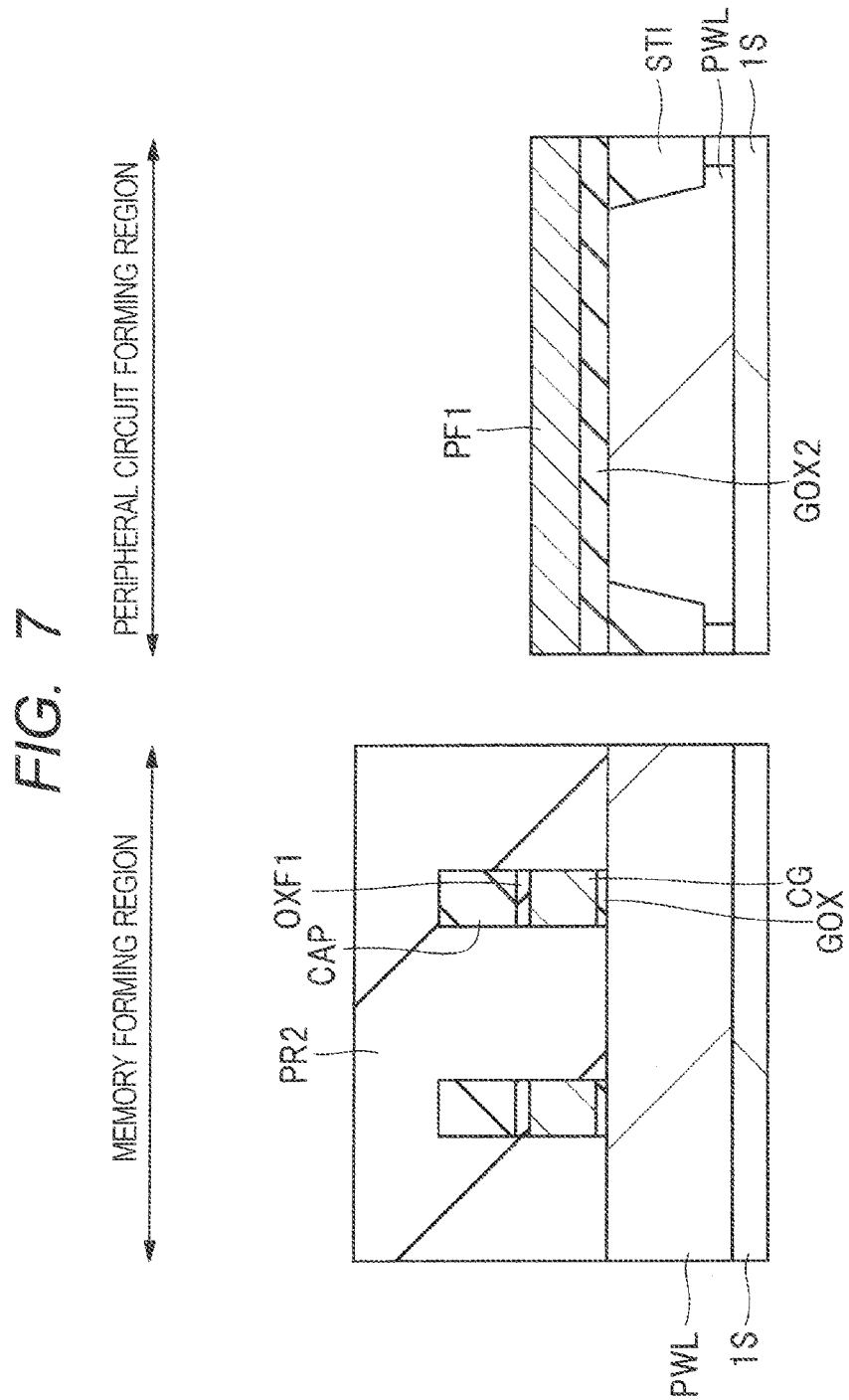
FIG. 7 is a sectional view of the semiconductor device during a manufacturing process succeeding to FIG. 6.

Successively, FIG. 7 shows a process of removing the cap insulating film CAP and the silicon oxide film OXF1 in the peripheral circuit forming region (Step S7 in FIG. 3). As shown in FIG. 7, a resist film (resist mask) PR2 having a pattern to cover the memory cell forming region and expose the peripheral circuit forming region is formed by a photolithography technology. The cap insulating film CAP and the silicon oxide film OXF1 in the peripheral circuit forming region exposed from the resist film (resist mask) PR2 are removed by etching and successively the resist film PR2 is removed. Step S7 will be explained in detail later.

Figure 8:
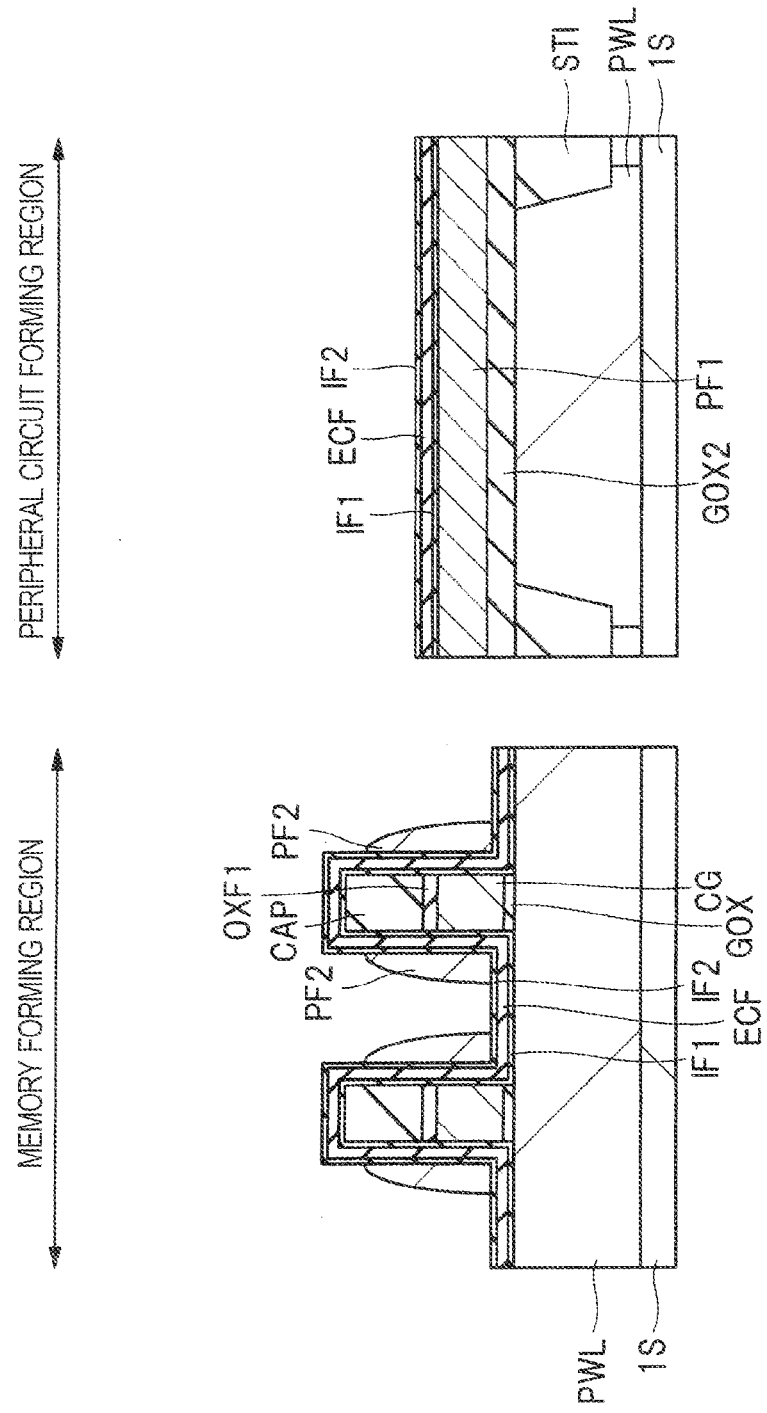
FIG. 8 is a sectional view of the semiconductor device during a manufacturing process succeeding to FIG. 7.

Successively, FIG. 8 shows a process of forming an insulating film IF1, a charge accumulation film ECF, an insulating film IF2, and a polysilicon film PF2 and further applying etch back to the polysilicon film PF2 (Step S8 in FIG. 3). Firstly, the insulating film IF1 is formed over the whole surface of the semiconductor substrate 1S and the charge accumulation film ECF is formed over the insulating film IF1. Then the insulating film IF2 is formed over the charge accumulation film ECF and the polysilicon film PF2 is formed over the insulating film IF2. In the memory cell forming region, the insulating film IF1, the charge accumulation film ECF, the insulating film IF2, and the polysilicon film PF2 are formed in sequence along the top surface and the side surfaces of the laminated structure comprising the gate insulating film GOX, the control gate electrode CG, the silicon oxide film OXF1, and the cap insulating film CAP. In the peripheral circuit forming region, an insulating film IF1, a charge accumulation film ECF, an insulating film IF2, and a polysilicon film PF2 are formed in sequence over the polysilicon film PF1.

The insulating film IF1 comprises a silicon oxide film for example and an ISSG oxidation method that allows a silicon oxide film of dense and good film quality to be formed can be used for example. The film thickness of the insulating film IF1 is about 4 nm. Further, the charge accumulation film ECF comprises a silicon nitride film and can be formed by a CVD method for example. The film thickness of the charge accumulation film ECF is about 10 nm. Furthermore, the insulating film IF2 comprises a silicon oxide film and a "high-temperature CVD method" typified by an HTO method that allows a silicon oxide film of dense and good film quality to be formed is used for example. The film thickness of the insulating film IF2 is about 5 nm. In addition, the polysilicon film PF2 can be formed by a CVD method for example. In this way, a laminated insulating film (ONO film) of dense, excellent in insulation property, and good film quality can be formed.

Successively, the polysilicon film PF2 is removed by applying a whole surface etch back method (anisotropic dry etching) to the polysilicon film PF2. On this occasion, as shown in FIG. 8, in the memory cell forming region, a sidewall-shaped polysilicon film PF2 remains only over the sidewalls on both the sides of the laminated structure and, in the peripheral circuit forming region, the polysilicon film PF2 over the insulating film IF2 is removed and the insulating film IF2 is exposed.

Figure 9:
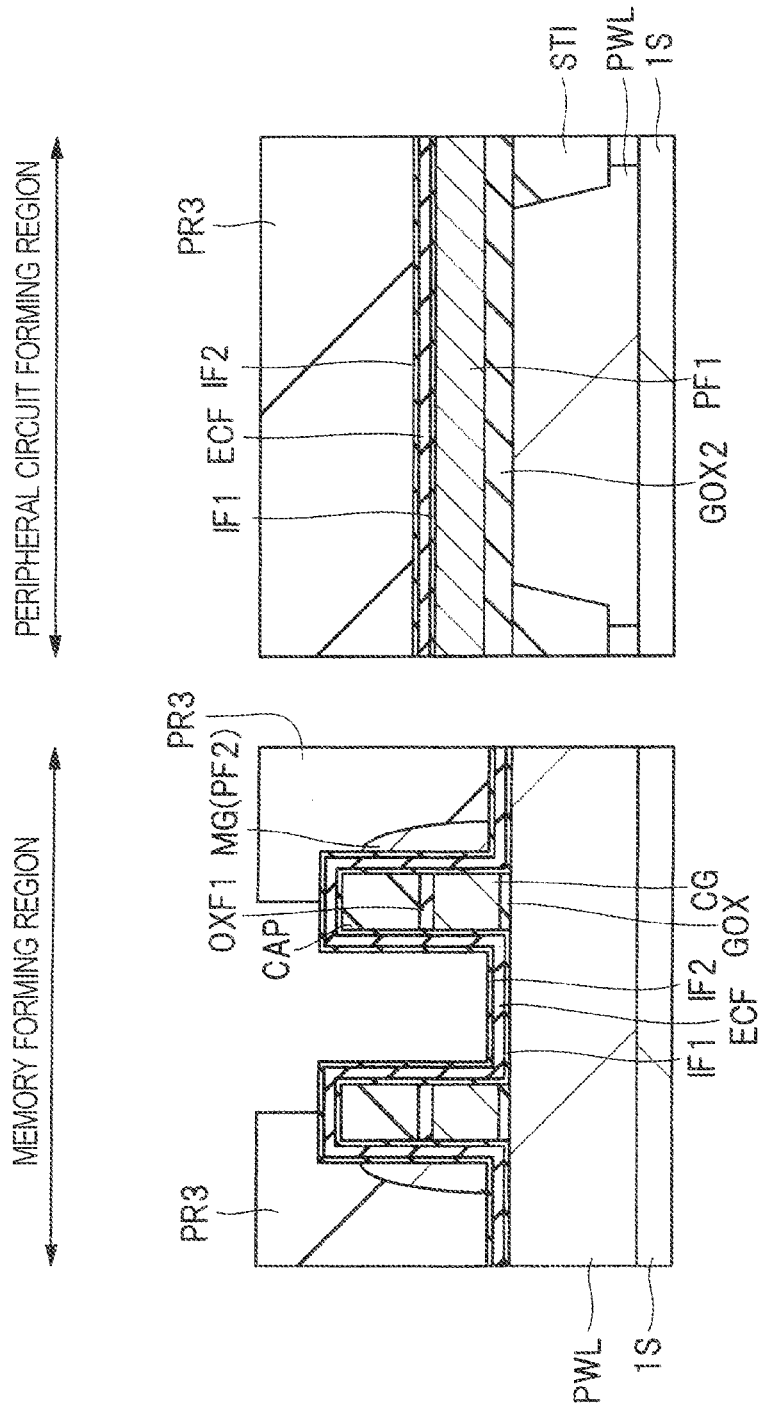
FIG. 9 is a sectional view of the semiconductor device during a manufacturing process succeeding to FIG. 8.

Successively, FIG. 9 shows a memory gate electrode MG forming process (Step S9 in FIG. 3). As shown in FIG. 9, a resist film PR3 is formed so as to cover the polysilicon film PF2 formed on one side of the laminated structure in the memory cell forming region and cover the whole surface of the peripheral circuit forming region by a photolithography technology. Then the polysilicon film PF2 formed on the other side of the laminated structure exposed from a mask is removed by etching with the resist film PR3 used as the mask.

In this way, as shown in FIG. 9, a sidewall-shaped memory gate electrode MG can be formed over the sidewall on the one side of the laminated structure formed in the memory cell forming region with the laminated insulating film (ONO film) interposed.

Figure 10:
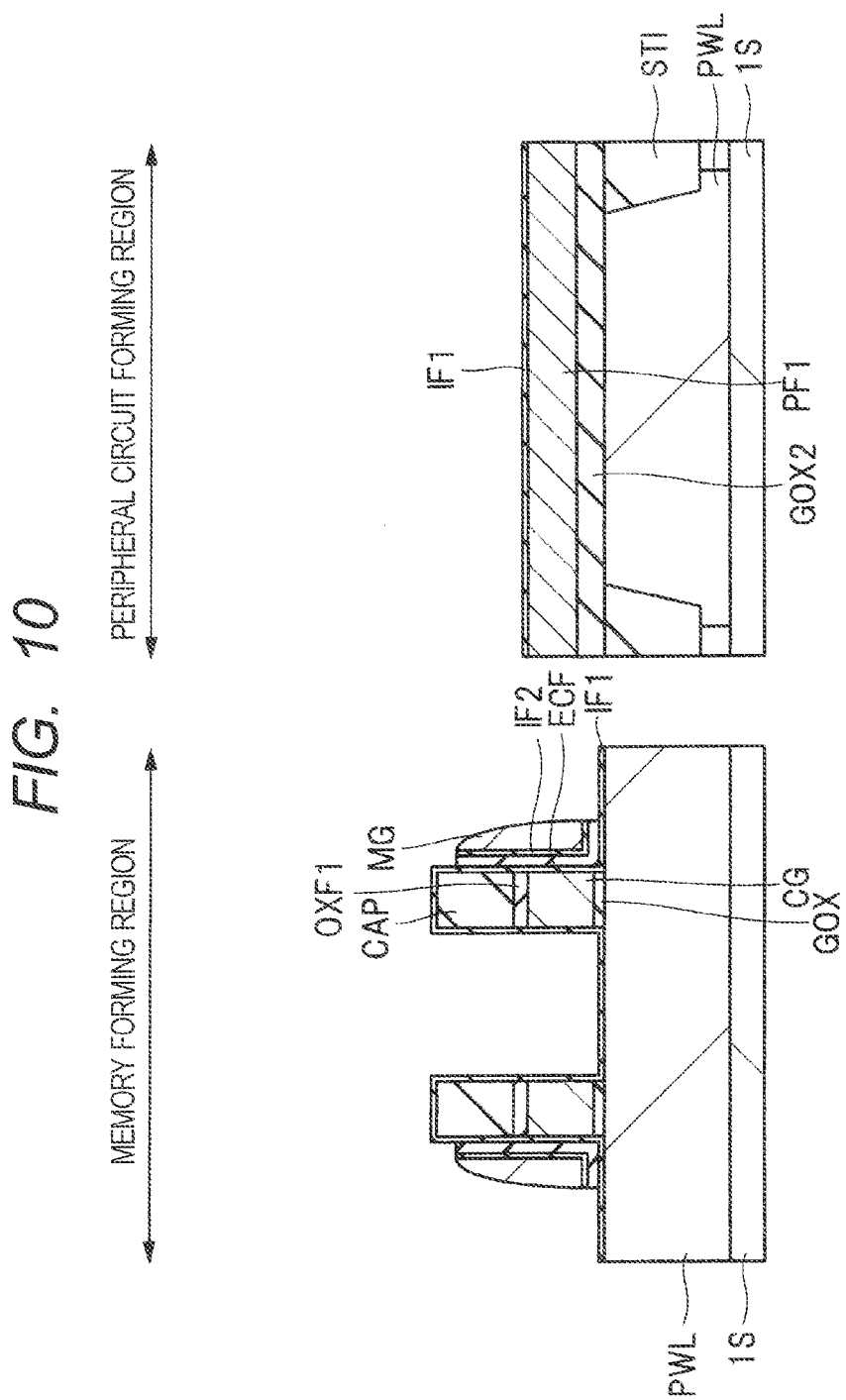
FIG. 10 is a sectional view of the semiconductor device during a manufacturing process succeeding to FIG. 9.

Successively, FIG. 10 shows a process of removing the insulating film IF2 and the charge accumulation film ECF (Step S10 in FIG. 3). After the resist film PR3 is removed, in the memory cell forming region, the insulating film IF2 exposed from the memory gate electrode MG is removed by etching and, in the peripheral circuit forming region too, the insulating film IF2 is removed by etching. Successively, in the memory cell forming region, the charge accumulation film ECF exposed from the memory gate electrode MG is removed by etching and, in the peripheral circuit forming region too, the charge accumulation film ECF is removed by etching. As a result, in the memory cell forming region, the insulating film IF1 is exposed from the memory gate electrode MG and, in the peripheral circuit forming region too, the insulating film IF1 is exposed. Here, the insulating film IF1 is not removed by etching and remains.

Figure 11:
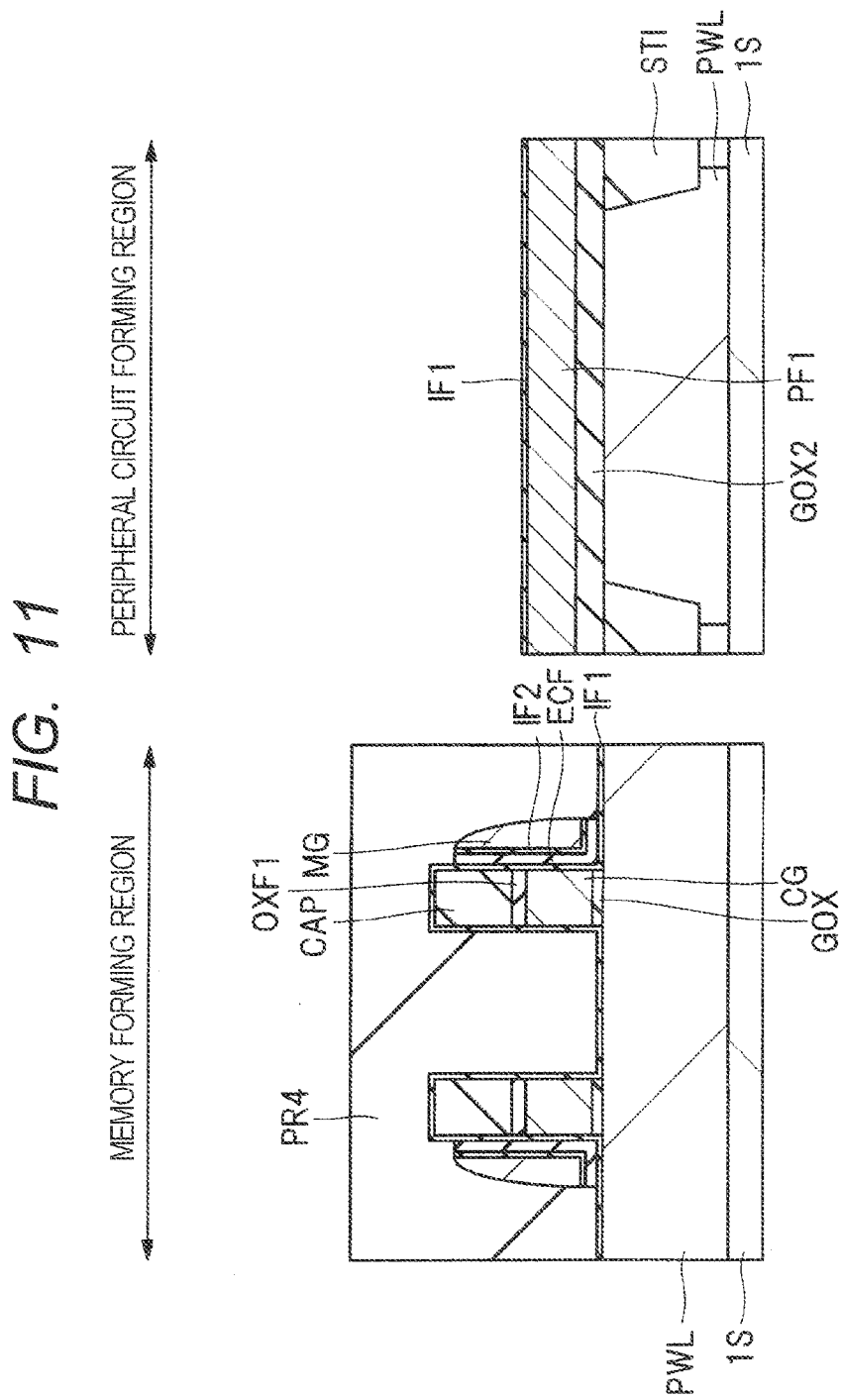
FIG. 11 is a sectional view of the semiconductor device during a manufacturing process succeeding to FIG. 10.

Successively, FIG. 11 shows a process of injecting impurities into the polysilicon film PF1 (Step S11 in FIG. 3). As shown in FIG. 11, after the memory cell forming region is covered with a resist film PR4 by a photolithography technology, n-type impurities such as phosphorus are introduced into the polysilicon film PF1 formed in the peripheral circuit forming region by an ion implantation method. Successively, after the resist film PR4 that covers the memory cell forming region is removed, annealing is applied in a nitrogen atmosphere.

Figure 12:
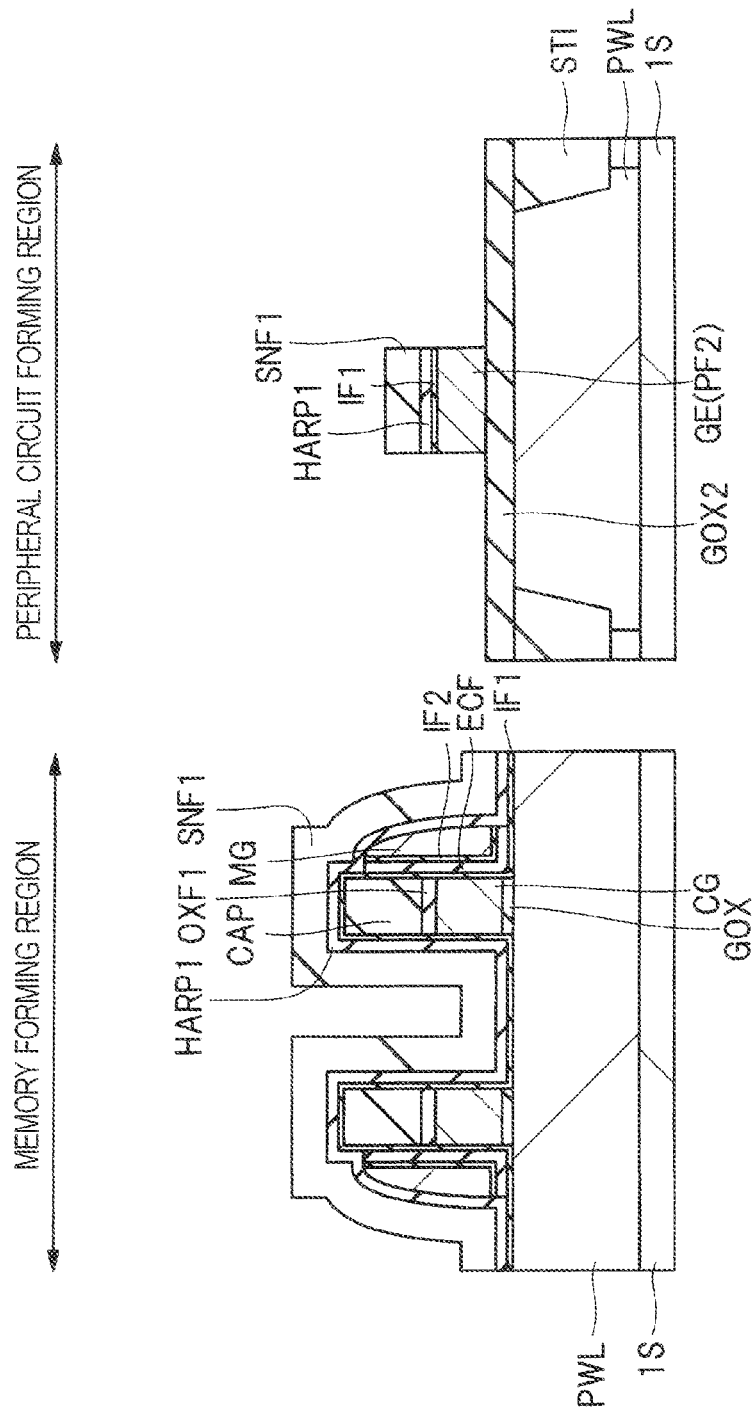
FIG. 12 is a sectional view of the semiconductor device during a manufacturing process succeeding to FIG. 11.

Successively, FIG. 12 shows a process of forming a gate electrode GE (Step S12 in FIG. 4). A silicon oxide film HARP1 is formed over the semiconductor substrate 1S and a silicon nitride film SNF1 is formed over the silicon oxide film HARP1. That is, in First Embodiment, the silicon oxide film HARP1 that is to be a protective insulating film is formed over the insulating film IF1 exposed from the memory gate electrode MG, the exposed end surface of the charge accumulation film ECF, the exposed end surface of the insulating film IF2, and the memory gate electrode MG. The silicon oxide film HARP1 is formed by a "low-temperature CVD method" for example and the silicon nitride film SNF1 is formed by a CVD method for example.

Successively, a patterned resist film (resist mask) is formed by a photolithography technology. By anisotropic dry etching with the patterned resist film used as a mask, the silicon nitride film SNF1, the silicon oxide film HARP1, the insulating film IF1, and the polysilicon film PF2 are processed and the gate electrode GE is formed (patterned) in the peripheral circuit forming region. On this occasion, the memory cell forming region is not influenced by the etching because it is covered with the resist film.

Figure 13:
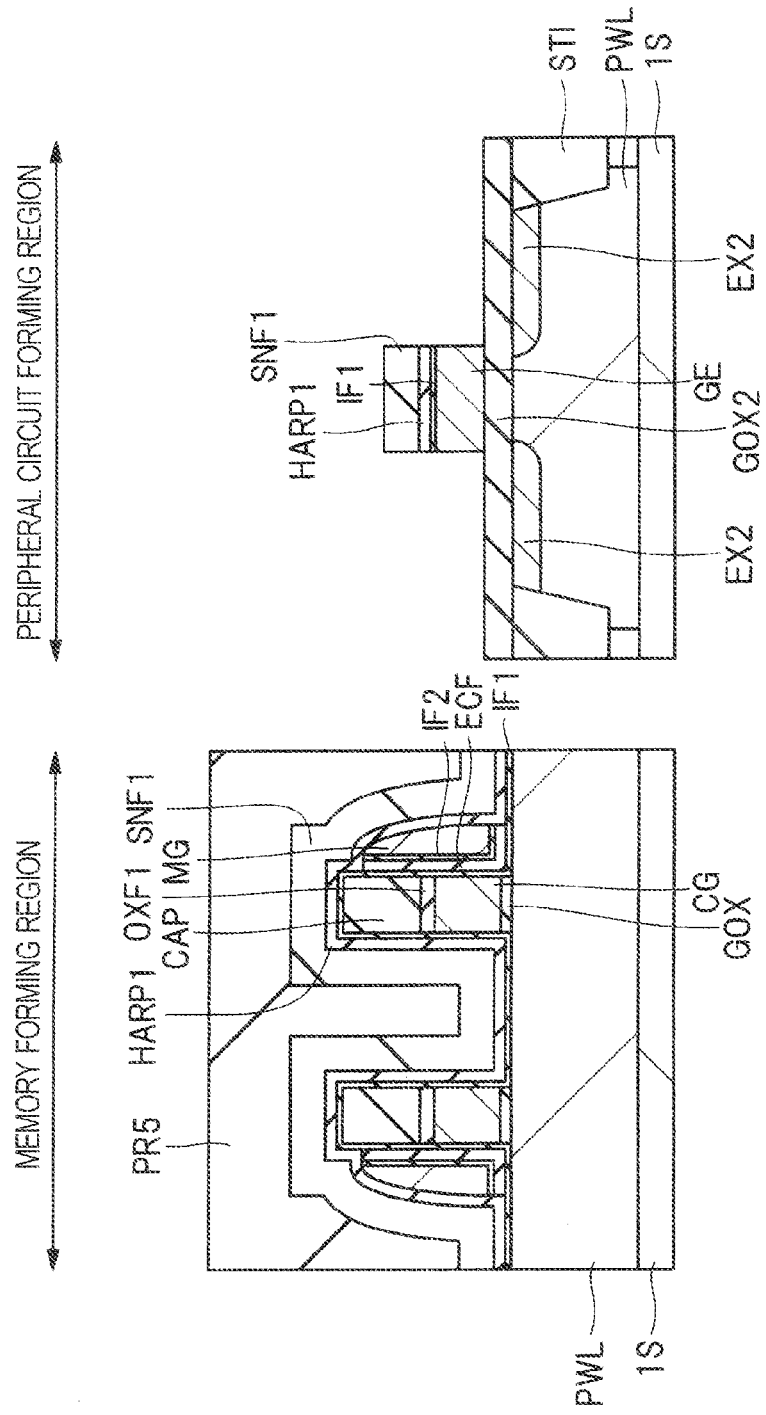
FIG. 13 is a sectional view of the semiconductor device during a manufacturing process succeeding to FIG. 12.

Successively, FIG. 13 shows a process of forming low concentration impurity diffusion regions EX2 (Step S13 in FIG. 4). As shown in FIG. 13, after a resist film PR5 to cover the memory cell forming region is formed by a photolithography technology, shallow low concentration impurity diffusion regions EX2 conforming to the gate electrode GE are formed by an ion implantation method with the resist film PR5 used as a mask in the peripheral circuit forming region. The shallow low concentration impurity diffusion regions EX2 are n-type semiconductor regions into which n-type impurities such as phosphorus or arsenic are introduced.

Figure 14:
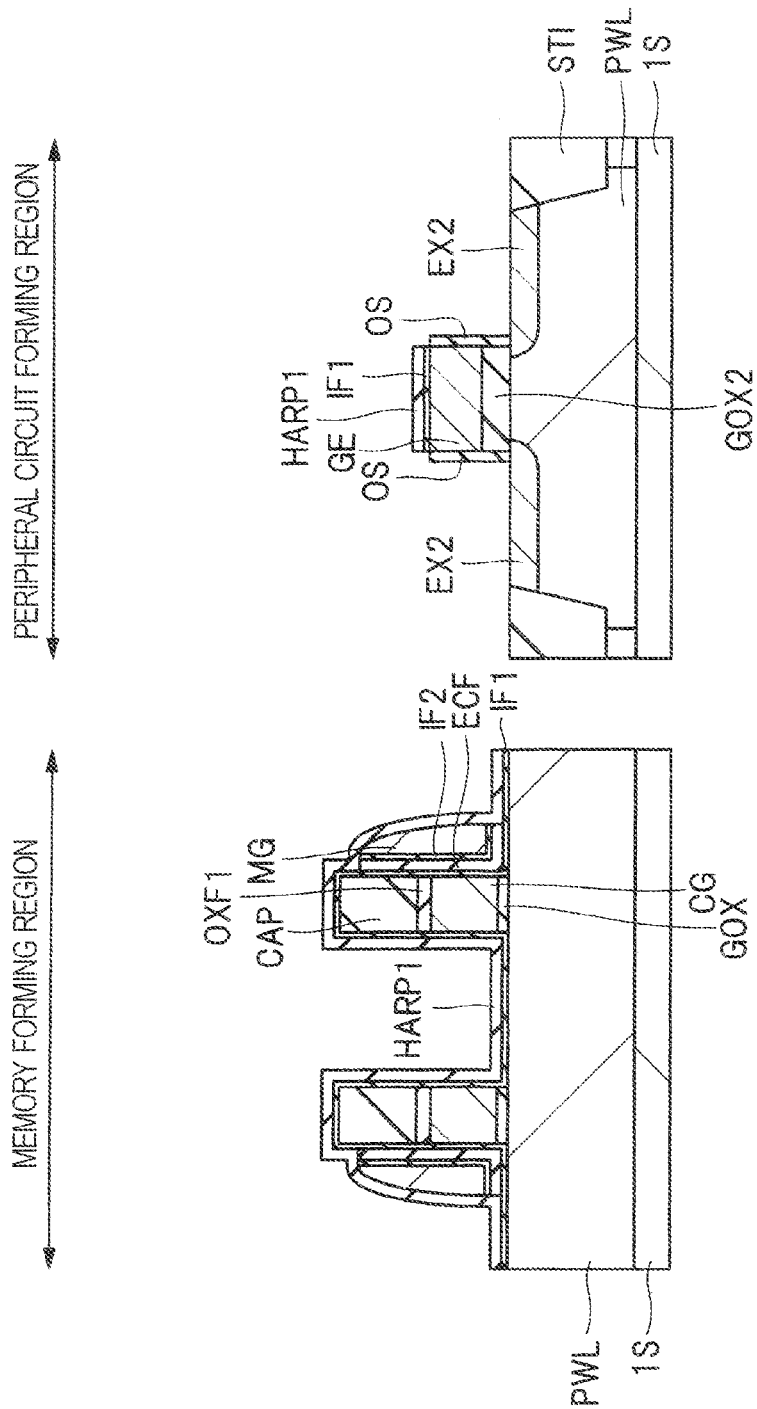
FIG. 14 is a sectional view of the semiconductor device during a manufacturing process succeeding to FIG. 13.

Successively, FIG. 14 shows a process of forming offset spacers OS (Step S14 in FIG. 4). After offset spacers OS are formed over the sidewalls on both the sides of the gate electrode GE formed in the peripheral circuit forming region, the silicon nitride film SNF1 formed in the memory cell forming region and the peripheral circuit forming region is removed. Then annealing is applied in a nitrogen atmosphere.

Figure 15:
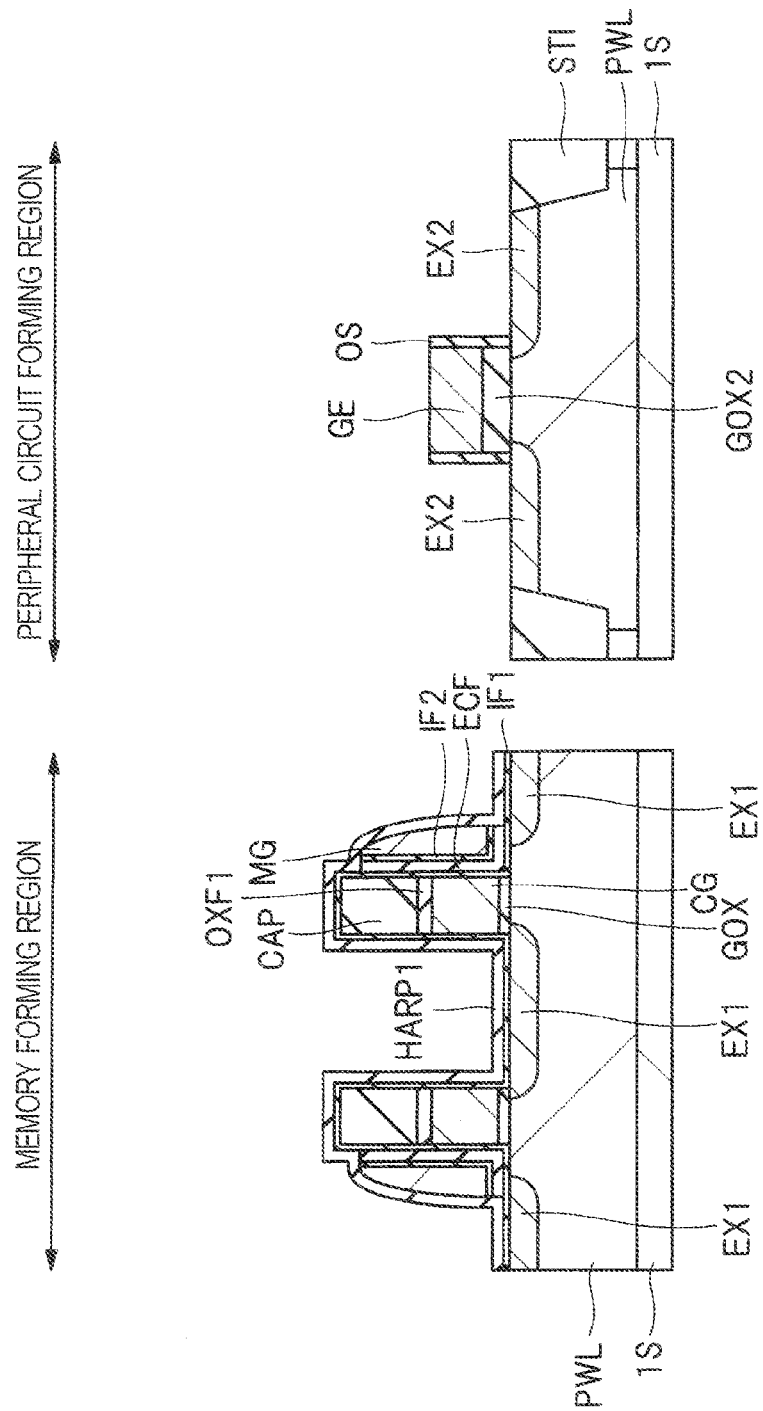
FIG. 15 is a sectional view of the semiconductor device during a manufacturing process succeeding to FIG. 14.

Successively, FIG. 15 shows a process of forming low concentration impurity diffusion regions EX1 (Step S15 in FIG. 4). As shown in FIG. 15, shallow low concentration impurity diffusion regions EX1 conforming to the control gate electrode CG and the memory gate electrode MG are formed by a photolithography technology and an ion implantation method in the memory cell forming region. The shallow low concentration impurity diffusion regions EX1 are n-type semiconductor regions into which n-type impurities such as phosphorus or arsenic are introduced.

Figure 16:
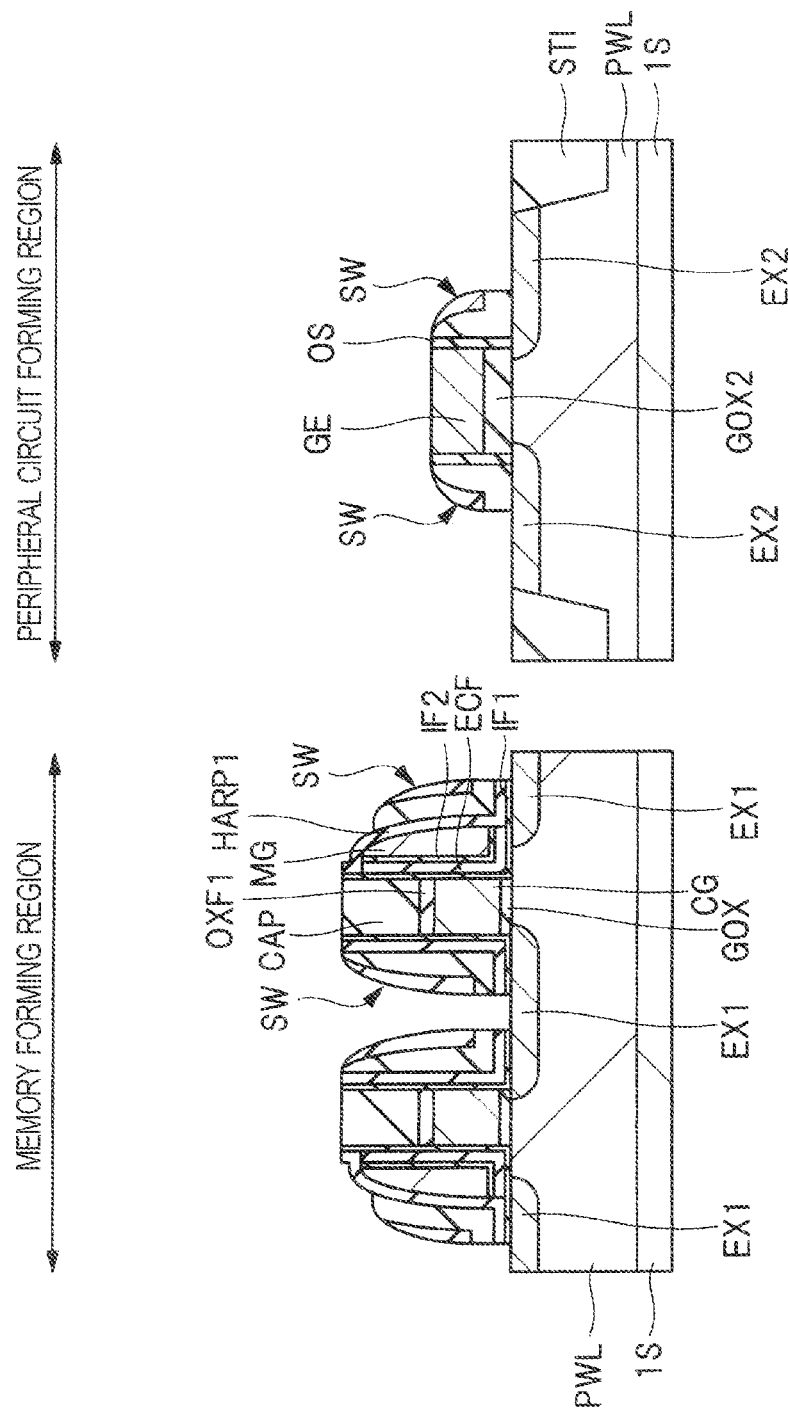
FIG. 16 is a sectional view of the semiconductor device during a manufacturing process succeeding to FIG. 15.

Successively, FIG. 16 shows a sidewall SW forming process (Step S16 in FIG. 4). A silicon oxide film is formed over the semiconductor substrate 1S and a silicon nitride film is formed over the silicon oxide film. The silicon oxide film and the silicon nitride film can be formed by a CVD method for example. Then sidewalls SW are formed by anisotropically etching the silicon oxide film and the silicon nitride film. In the memory cell forming region, sidewalls SW are formed over the sidewall of the control gate electrode CG (laminated structure) and the sidewall of the memory gate electrode MG. Further in the peripheral circuit forming region, sidewalls SW are formed over the sidewalls on both the sides of the gate electrode GE.

Figure 17:
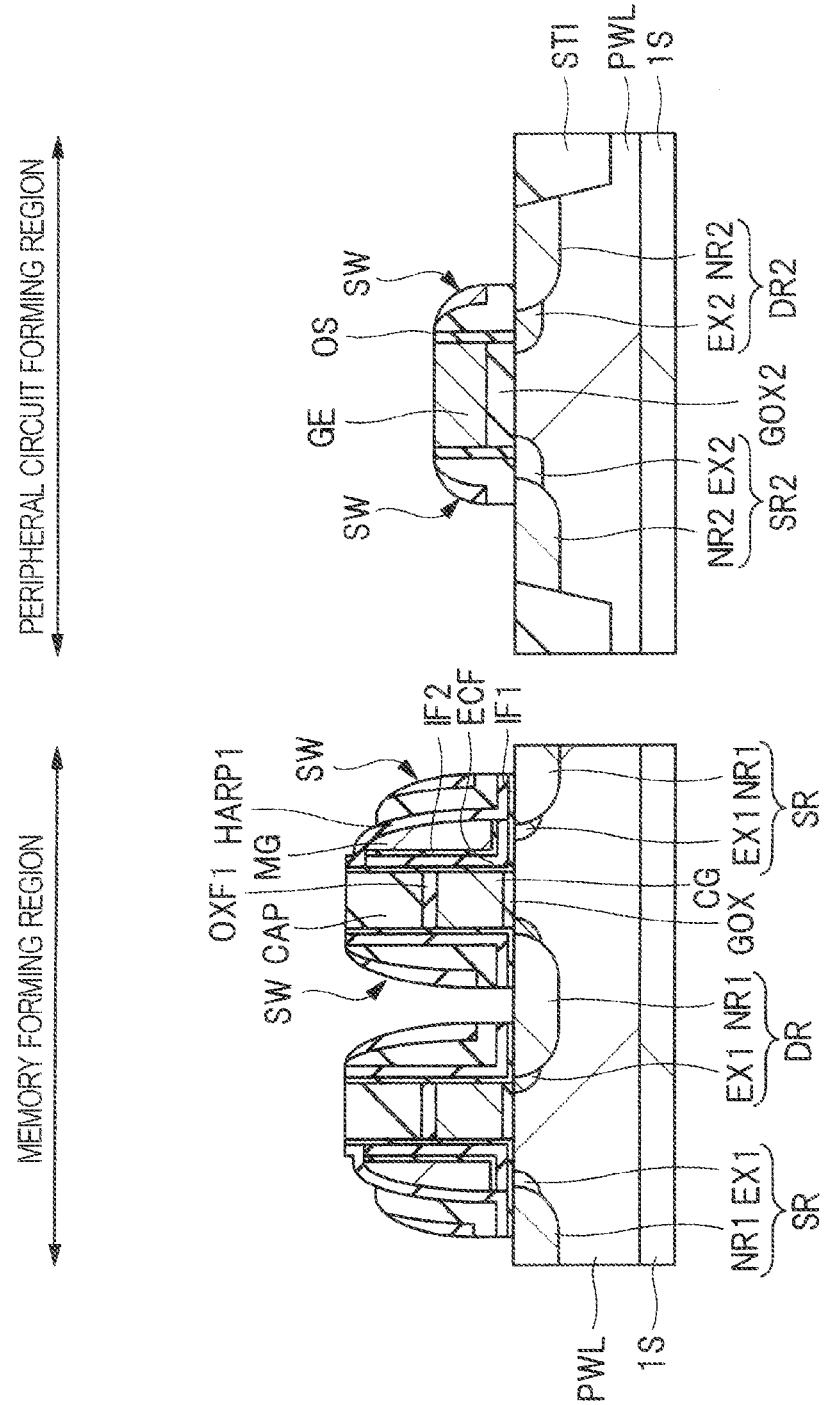
FIG. 17 is a sectional view of the semiconductor device during a manufacturing process succeeding to FIG. 16.

Successively, FIG. 17 shows a process of forming high concentration impurity diffusion regions NR1 and NR2 (Step S17 in FIG. 4). Deep high concentration impurity diffusion regions NR1 conforming to the sidewalls SW are formed in the memory cell forming region by a photolithography technology and an ion implantation method. The deep high concentration impurity diffusion regions NR1 are n-type semiconductor regions into which n-type impurities such as phosphorus or arsenic are introduced. A source region SR and a drain region DR of a memory cell comprise the deep high concentration impurity diffusion regions NR1 and the shallow low concentration impurity diffusion regions EX1. In this way, by forming the source region SR and the drain region DR by the shallow low concentration impurity diffusion regions EX1 and the deep high concentration impurity diffusion regions NR1, the source region SR and the drain region DR can take an LDD (Lightly Doped Drain) structure.

Meanwhile, in the peripheral circuit forming region too, deep high concentration impurity diffusion regions NR2 conforming to the sidewalls SW are formed. The deep high concentration impurity diffusion regions NR2 are n-type semiconductor regions into which n-type impurities such as phosphorus or arsenic are introduced. A source region SR2 and a drain region DR2 of a high withstand voltage MISFET comprise the deep high concentration impurity diffusion regions NR2 and the shallow low concentration impurity diffusion regions EX2. In this way, by forming the source region SR2 and the drain region DR2 by the shallow low concentration impurity diffusion regions EX2 and the deep high concentration impurity diffusion regions NR2, the source region and the drain region can take an LDD (Lightly Doped Drain) structure.

Figure 18:
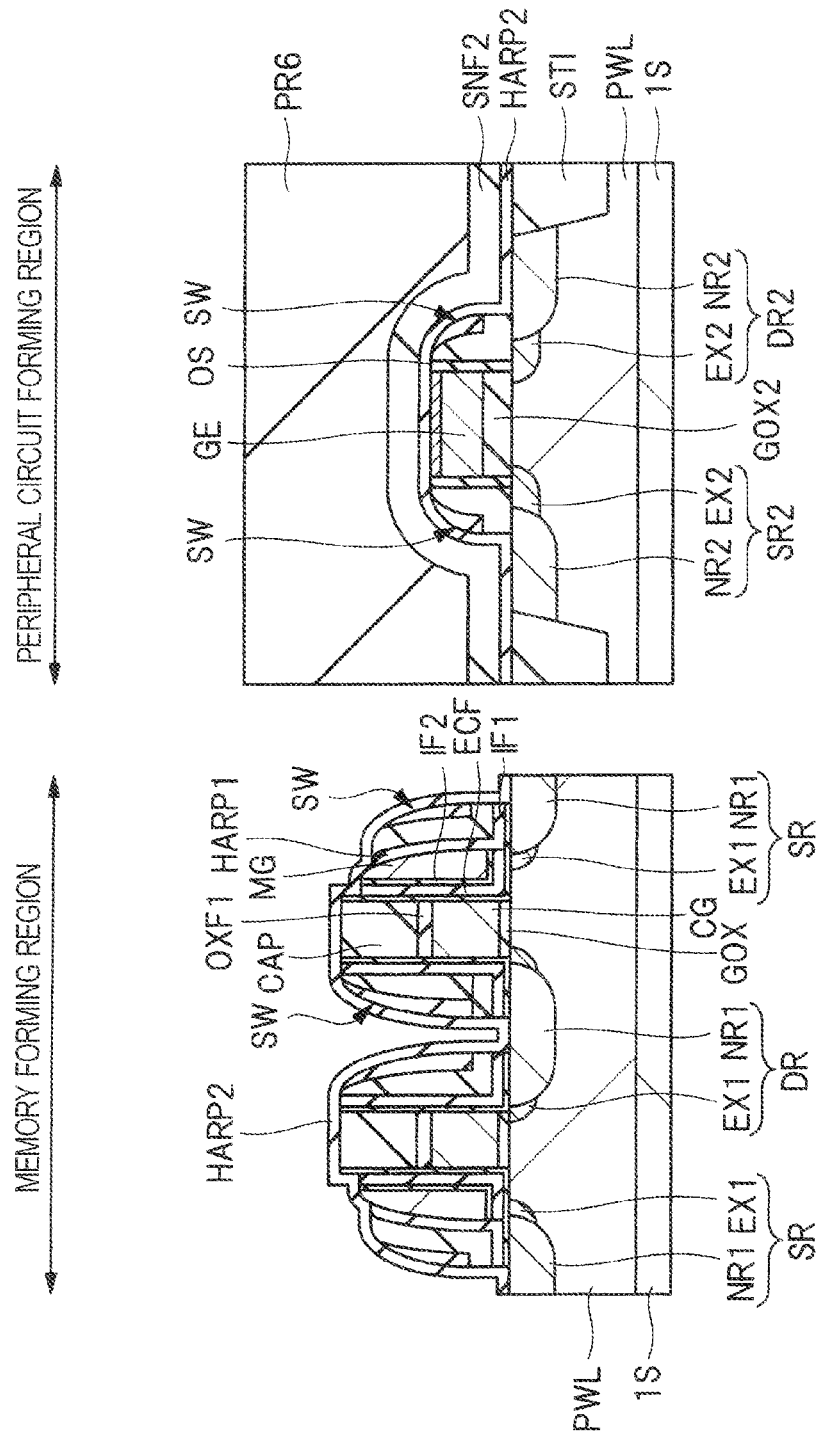
FIG. 18 is a sectional view of the semiconductor device during a manufacturing process succeeding to FIG. 17.

Successively, FIG. 18 shows a silicon nitride film SNF2 forming process (Step S18 in FIG. 4). Firstly, a silicon oxide film HARP2 is formed over the semiconductor substrate 1S and a silicon nitride film SNF2 is formed over the silicon oxide film HARP2. The silicon nitride film SNF2 is a film functioning as a "stress memorization technique film (SMT film)". Successively, after the peripheral circuit forming region is covered with a resist film PR6 by a photolithography technology, the silicon nitride film SNF2 formed in the memory cell forming region is removed by etching. On this occasion, the silicon oxide film HARP2 formed under the silicon nitride film SNF2 functions as an etching stopper film. Then after the resist film PR6 is removed, annealing is applied.

Figure 19:
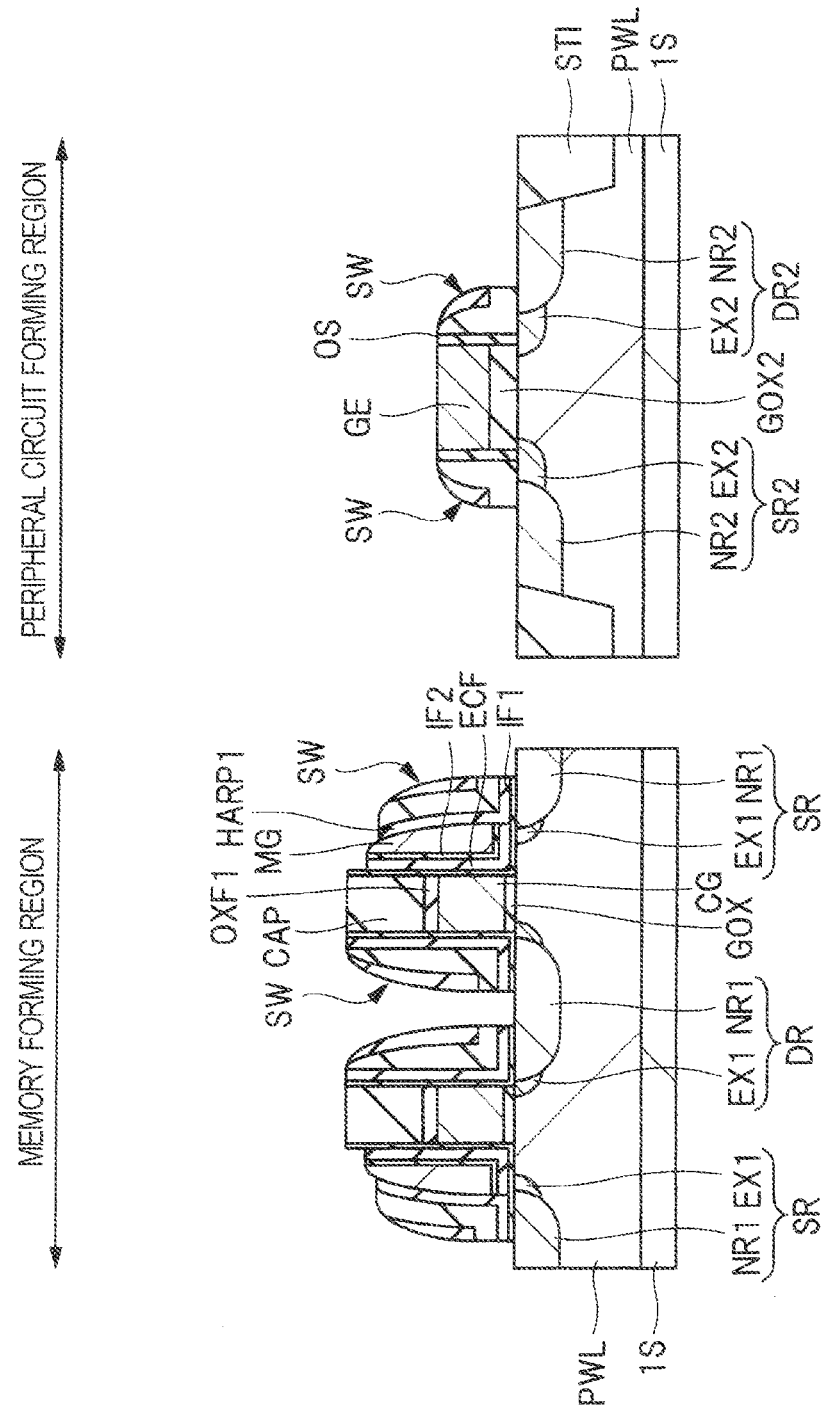
FIG. 19 is a sectional view of the semiconductor device during a manufacturing process succeeding to FIG. 18.

Successively, FIG. 19 shows a silicon nitride film SNF2 removing process (Step S19 in FIG. 4). After the silicon nitride film SNF2 formed in the peripheral circuit forming region is removed by etching, the silicon oxide film HARP2 formed in the memory cell forming region and the peripheral circuit forming region is removed by etching.

Figure 20:
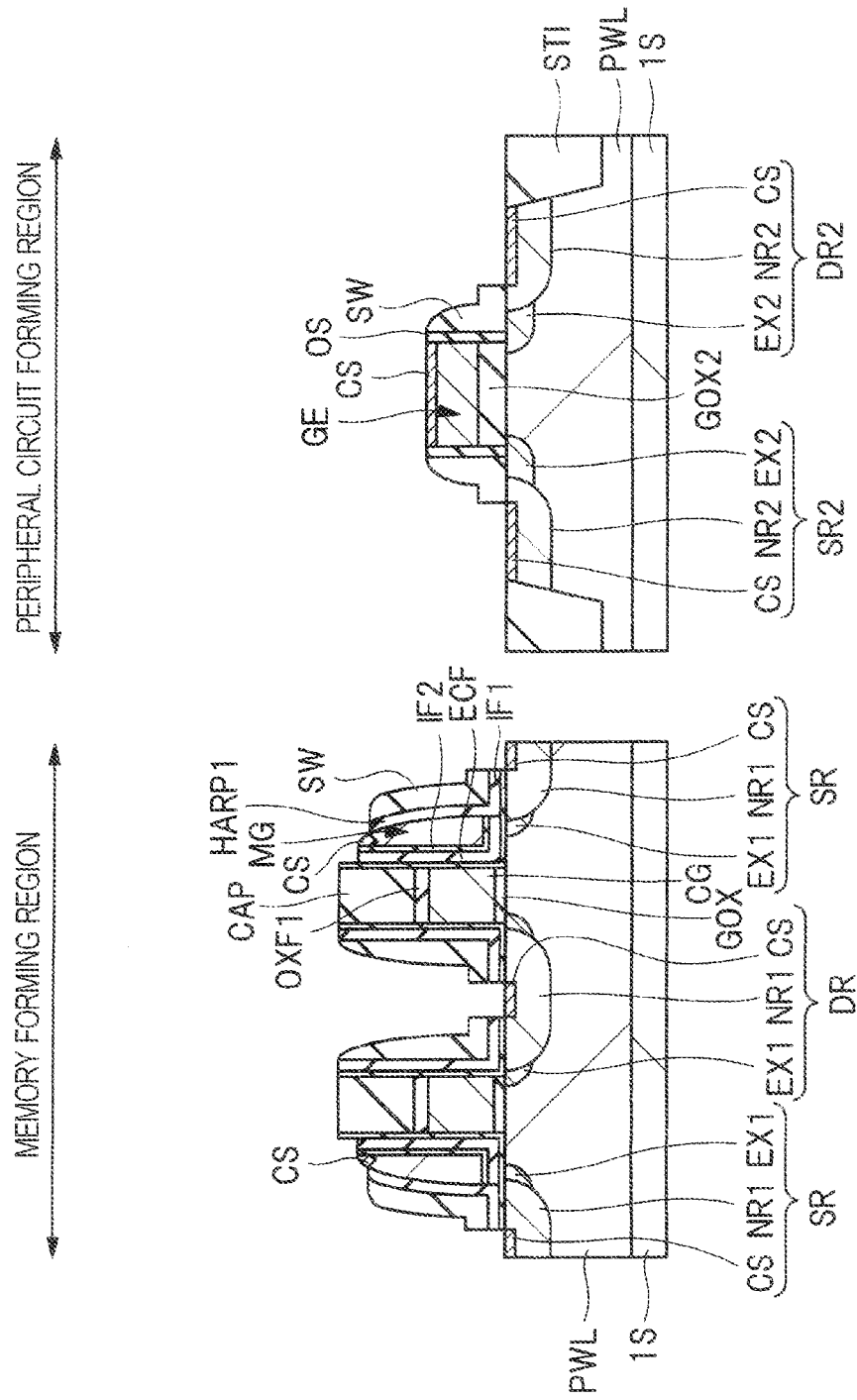
FIG. 20 is a sectional view of the semiconductor device during a manufacturing process succeeding to FIG. 19.

Successively, FIG. 20 shows a process of forming a silicide film CS (Step S20 in FIG. 4). After a nickel platinum film (NiPt film) is formed over the semiconductor substrate 1S, by applying heat treatment, the polysilicon film constituting the memory gate electrode MG and the nickel platinum film react and a silicide film CS comprising a nickel platinum silicide film (NiPtSi film) is formed in the memory cell forming region. As a result, the memory gate electrode MG takes a laminated structure of the polysilicon film and the silicide film CS in the memory cell forming region. Likewise, over the surfaces of the deep high concentration impurity diffusion regions NR1 too, silicon and a nickel platinum film react and a silicide film CS is formed.

Likewise, in the peripheral circuit forming region too, a silicide film CS comprising a nickel platinum silicide film is formed over the surface of the polysilicon film constituting the gate electrode GE. As a result, the gate electrode GE comprises the polysilicon film and the silicide film CS. Further, over the surfaces of the deep high concentration impurity diffusion regions NR2 too, silicon and a nickel platinum film react and a silicide film CS comprising a nickel platinum silicide film is formed.

Here, in First Embodiment, the device is configured so as to form a nickel platinum silicide film but it is also possible to form a cobalt silicide film, a nickel silicide film, a titanium silicide film, or a platinum silicide film for example in place of the nickel platinum silicide film.

In this way, it is possible to form: a memory cell constituting a nonvolatile memory in the memory cell forming region of the semiconductor substrate 1S; and a high withstand voltage MISFET in the peripheral circuit forming region.

Figure 21:
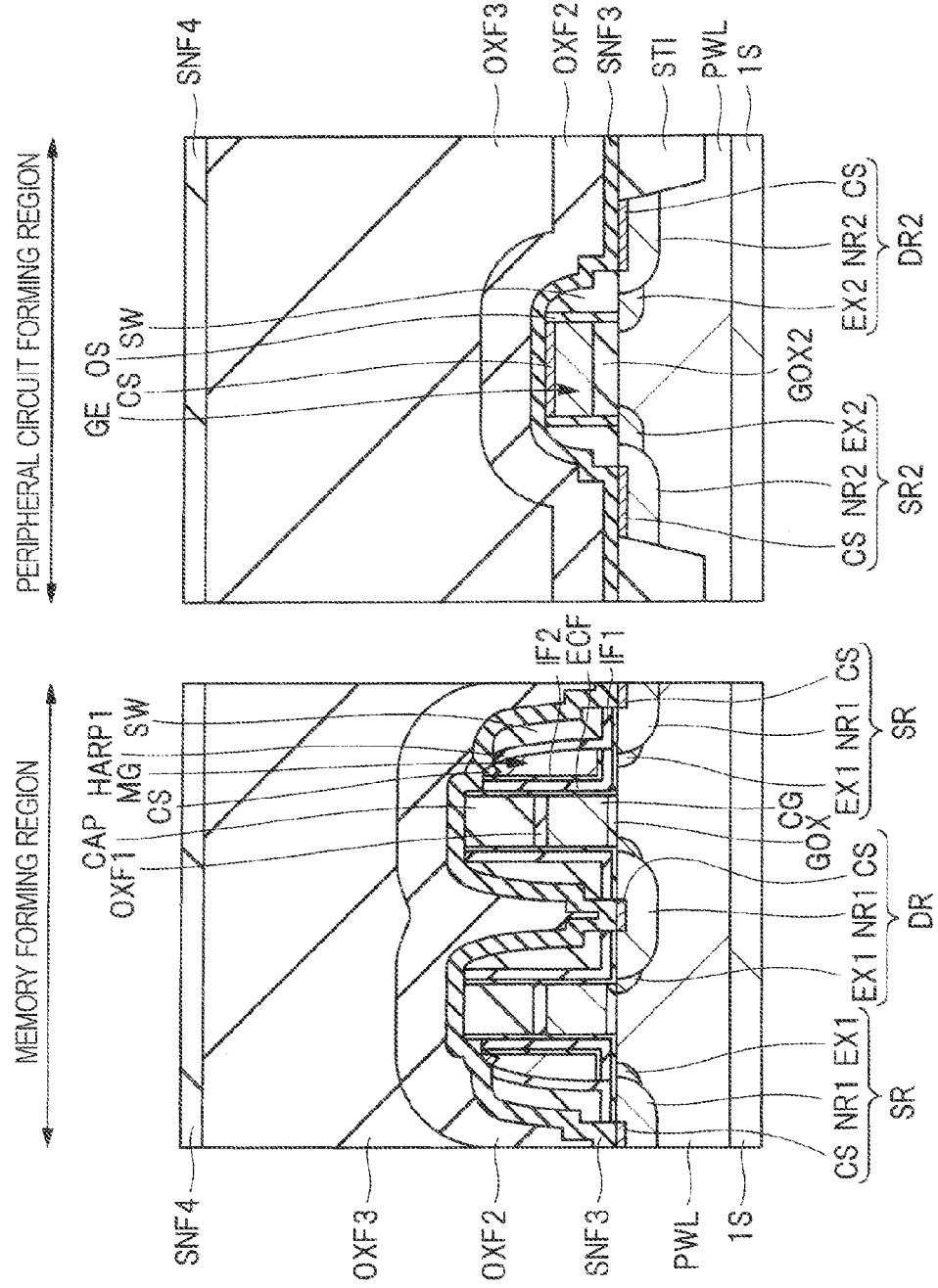
FIG. 21 is a sectional view of the semiconductor device during a manufacturing process succeeding to FIG. 20.

A wiring process is explained hereunder. FIG. 21 shows a process of forming a contact interlayer insulating film (Step S21 in FIG. 4). As shown in FIG. 21, a silicon nitride film SNF3 is formed over the principal surface of the semiconductor substrate 1S, a silicon oxide film OXF2 is formed over the silicon nitride film SNF3, and a silicon oxide film OXF3 is formed over the silicon oxide film OXF2. Successively, the surface of a contact interlayer insulating film is flattened by a CMP (Chemical Mechanical Polishing) method for example. Then after a part of the silicon oxide film OXF3 is etched back, a silicon nitride film SNF4 is formed over the silicon oxide film OXF3. As a result, the contact interlayer insulating film comprising the silicon nitride film SNF3, the silicon oxide film OXF2, the silicon oxide film OXF3, and the silicon nitride film SNF4 can be formed.

Figure 22:
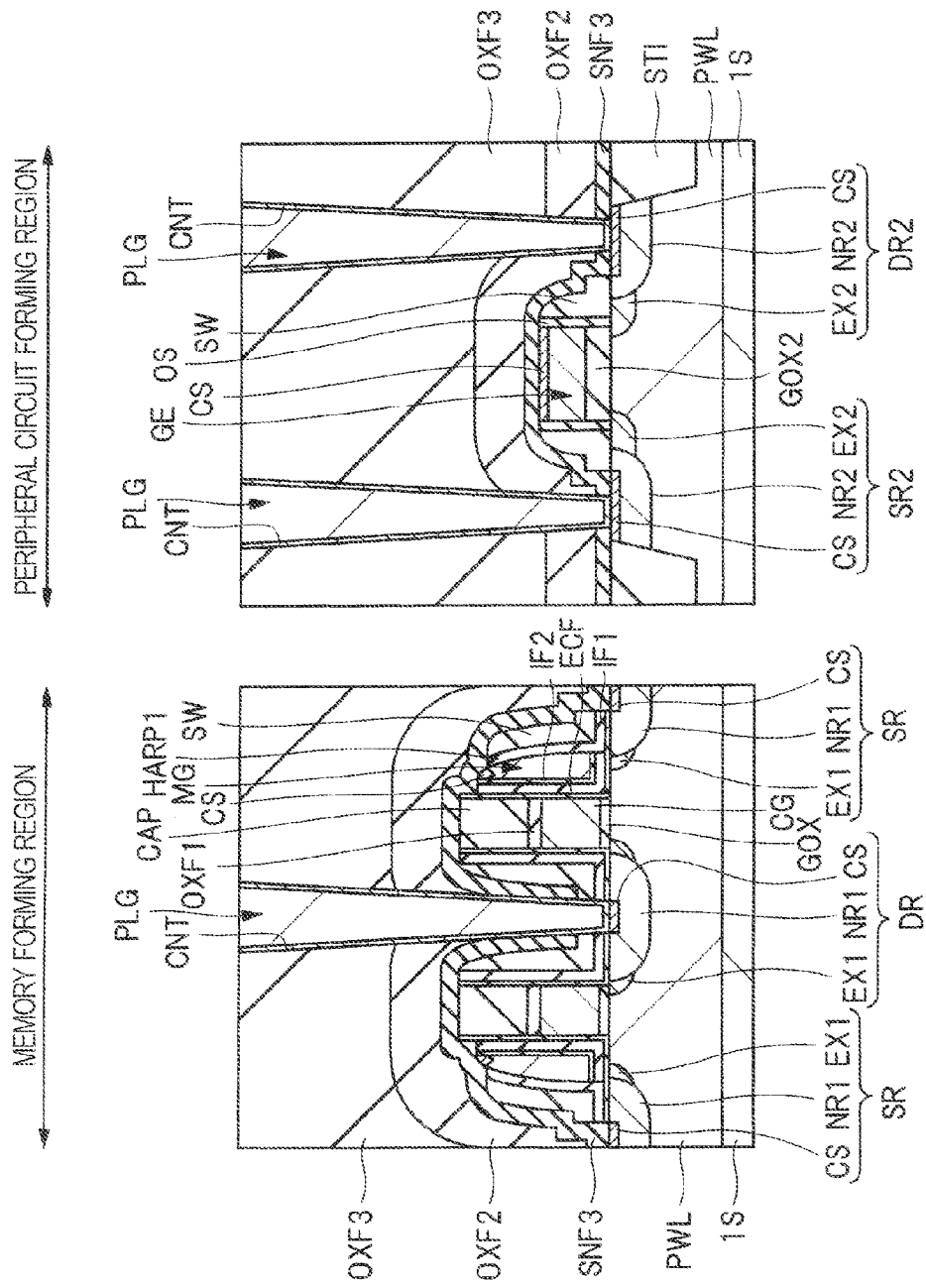
FIG. 22 is a sectional view of the semiconductor device during a manufacturing process succeeding to FIG. 21.

Successively, FIG. 22 shows a plug PLG forming process (Step S22 in FIG. 4). Contact holes CNT are formed in the contact interlayer insulating film by a photolithography technology and an etching technology. Successively, a titanium/titanium nitride film is formed over the contact interlayer insulating film including the bottom surfaces and the inner walls of the contact holes CNT. The titanium/titanium nitride film comprises a laminated film of a titanium film and a titanium nitride film and can be formed by a sputtering method for example. The titanium/titanium nitride film has: the function of preventing tungsten that is a material of the film embedded at a later process from diffusing into silicon; namely a so-called barrier property for example.

Then a tungsten film is formed over the whole principal surface of the semiconductor substrate 1S so as to fill the contact holes CNT. The tungsten film can be formed by a CVD method for example. Then the unnecessary titanium/ titanium nitride film and tungsten film formed over the contact interlayer insulating film are removed by a CMP method for example. Here, the silicon nitride film SNF4 is removed simultaneously at the CMP process. Then plugs PLG can be formed by applying annealing in a hydrogen atmosphere.

Successively, as shown in FIG. 2, an interlayer insulating film comprising a silicon oxide film OXF4 and an SiOC film SCF1 formed over the silicon oxide film OXF4 is formed over the contact interlayer insulating film in which the plugs PLG are formed. Then wiring gutters DIT1 are formed in the interlayer insulating film by a photolithography technology and an etching technology. Successively, a tantalum/tantalum nitride film is formed over the interlayer insulating film including the insides of the wiring gutters DIT1. The tantalum/tantalum nitride film can be formed by a sputtering method for example. Successively, after a seed film comprising a thin copper film is formed over the tantalum/tantalum nitride film by a sputtering method for example, a copper film is formed over the interlayer insulating film in which the wiring gutters DIT1 are formed by an electrolytic plating method using the seed film as an electrode. Successively, by polishing and removing the copper film exposed over the interlayer insulating film outside the interiors of the wiring gutters DIT1 by a CMP method for example, the copper film remains only in the wiring gutters DIT1 formed in the interlayer insulating film. As a result, wires L1 can be formed. Further, wires are formed over the wires L1 but are not explained here. In this way, a semiconductor device according to First Embodiment can be formed finally.

Here, although explanations have been made on the basis of the example of forming the wires L1 comprising a copper film in First Embodiment, it is also possible to form wires L1 comprising an aluminum film for example. On this occasion, a titanium/titanium nitride film, an aluminum film, and a titanium/titanium nitride film are formed in sequence over the interlayer insulating film and the plugs PLG. Those films can be formed by a sputtering method for example. Successively, those films are patterned by a photolithography technology and an etching technology and the wires L1 are formed. As a result, it is possible to form the wires L1 comprising an aluminum film.

Figure 23:
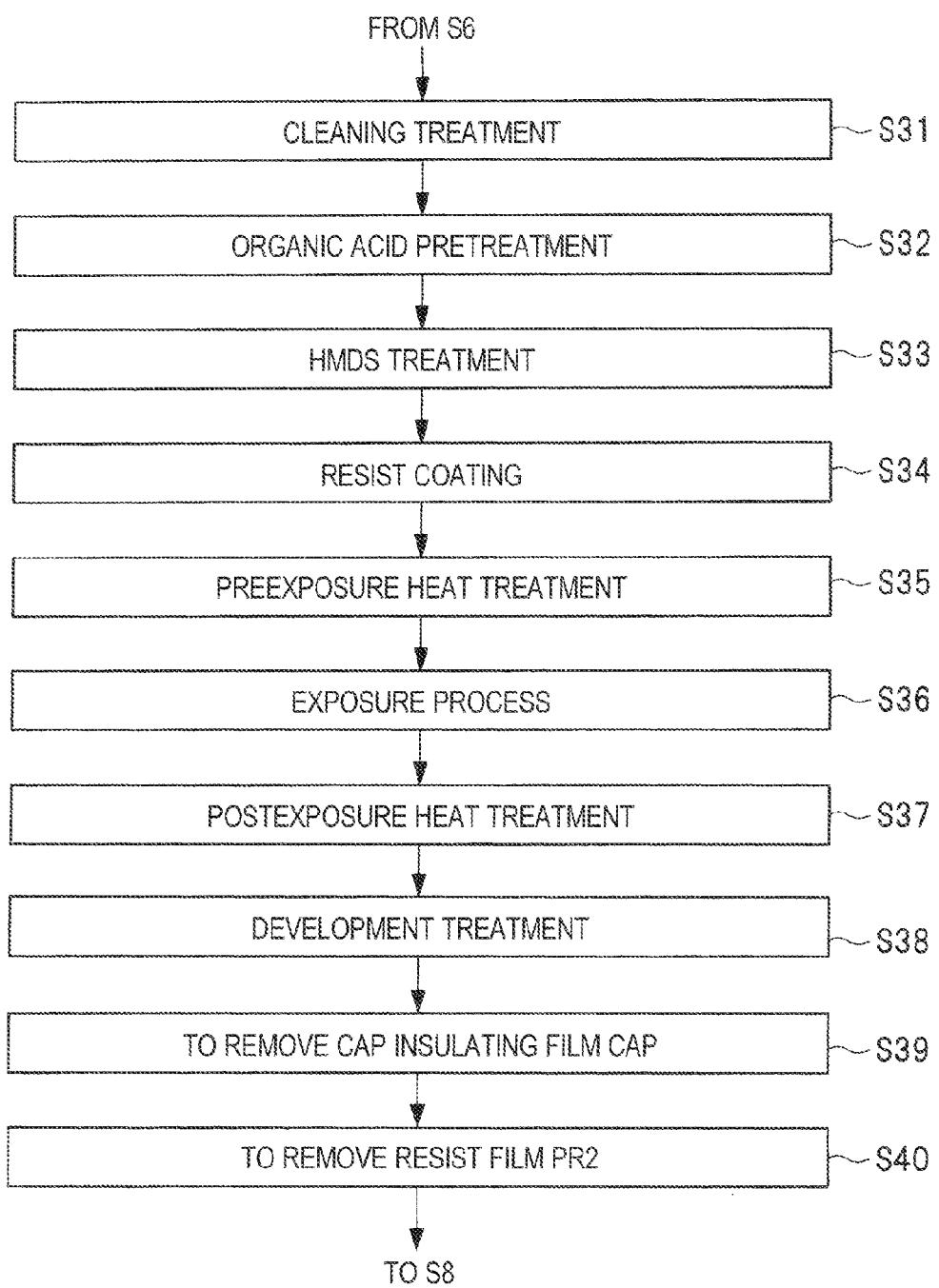
FIG. 23 is a process flow diagram showing a detailed process of Step S7 in FIG. 3.

Step S7 in FIG. 3 that is a feature of First Embodiment is hereunder explained in further detail. FIG. 23 is a process flow diagram showing detailed processes of Step S7.

As explained in reference to FIG. 6, in the memory cell forming region, the cap insulating film CAP, the silicon oxide film OXF1, the polysilicon film PF1, and the gate insulating film GOX are patterned in sequence by etching with the patterned resist film PR1 used as a mask. Then a laminated structure comprising the gate insulating film GOX, the control gate electrode CG, the silicon oxide film OXF1, and the cap insulating film CAP is formed. That is, the control gate electrode CG is formed (Step S6 in FIG. 3). Then the patterned resist film PR1 is subjected to ashing treatment and removed by oxygen (OA plasma or ozone ($O_3$) plasma for example.

Meanwhile, in order to improve processing accuracy, it is also possible to: use a resist film PR1 and an antireflection film such as a BARC (Bottom Anti-Reflection Coating) in combination; or form an antireflection film not only by a single layer but by a multilayered structure. On this occasion, an antireflection film is processed with the resist film PR2 used as a mask and the cap insulating film CAP, the silicon oxide film OXF1, the polysilicon film PF1, and the gate insulating film GOX are patterned in sequence by anisotropic dry etching with the resist film PR2 and the antireflection film used as masks. After the dry etching is finished, the resist film PR1 and the antireflection film can be removed by ashing treatment of oxygen (OA plasma or ozone ($O_3$) plasma. Since the resist film PR2 and the antireflection film can be removed with an identical apparatus after the dry etching of the cap insulating film CAP, the silicon oxide film OXF1, the polysilicon film PF1, and the gate insulating film GOX is finished, the throughput can be improved.

Here, the reason why the ashing treatment of oxygen (OA plasma or ozone ($O_3$) plasma can be used for removing the resist film PR2 or the antireflection film is that the uppermost layer of the processed film which the resist film PR2 or the antireflection film touches is the cap insulating film CAP comprising a silicon nitride film. This is because the etching selectivity of the silicon nitride film to the resist film PR2 or the antireflection film is large at the ashing treatment of oxygen ($O_2$) plasma or ozone ($O_3$) plasma. Further, in the memory cell forming region, even when the surface of the cap insulating film CAP is damaged by oxygen (OA plasma or ozone ($O_3$) plasma, that does not influence the electrical properties of a memory cell. Furthermore, in the peripheral circuit forming region, even when damage is developed by oxygen (OA plasma or ozone ($O_3$) plasma, the damage is removed at a succeeding process and hence no problem arises.

Successively, cleaning treatment (Step S31 in FIG. 23) is applied and the surface of the semiconductor substrate 1S is cleaned. As the cleaning treatment, SPM (Sulfuric-acid Peroxide Mixture) cleaning to remove organic substances by sulfuric acid/hydrogen peroxide water mixture, AMP (Ammonium Hydrogen-Peroxide Mixture) cleaning to remove organic substances and particles by ammonia/hydrogen peroxide water mixture, or DHF (Diluted Hydrofluoric acid) cleaning to remove an oxide film by diluted hydrofluoric acid is applied for example. In the cleaning treatment, besides the above treatments, HPM (Hydrochloric acid Peroxide Mixture) cleaning to remove metals by chloric acid/hydrogen peroxide water mixture, pure water cleaning to remove particles (dust) or dirt by pure water, and the like are included. The cleaning treatments are generally used at manufacturing processes of a semiconductor device and are aimed at removing organic substances, particles, metal impurities, and others.

Successively, the resist film PR1 is removed and organic acid pretreatment (Step S32 in FIG. 23) is applied to the surface of the cap insulating film CAP exposed over the principal surface of the semiconductor wafer (semiconductor substrate 1S). After a chemical solution A prepared by mixing an organic acid and an organic solvent is supplied to the semiconductor wafer surface and is spread over the semiconductor wafer principal surface, heat treatment is applied to the semiconductor wafer. By the organic acid pretreatment, it is possible to prevent a resist residue (development residue) that will be described later from being generated. Here, as the organic acid, at least one kind selected from the group of monocarboxylic acid, sulfonic acid, and polycarboxylic acid is used. The monocarboxylic acid is at least one kind selected from the group of formic acid, acetic acid, propionic acid, butyric acid, isobutyric acid, valeric acid, isovaleric acid, caproic acid, caprylic acid, monochloroacetic acid, dichloroacetic acid, trichloroacetic acid, monofluoroacetic acid, difluoroacetic acid, trifluoroacetic acid, α-chlorobutyric acid, β-chlorobutyric acid, γ-chlorobutyric acid, lactic acid, glycolic acid, glyceric acid, pyruvic acid, glyoxalic acid, methacrylic acid, and acrylic acid. Then the sulfonic acid is at least one kind selected from the group of trifluoromethanesulfonic acid, methanesulfonic acid, benzenesulfonic acid, and toluenesulfonic acid and the polycarboxylic acid is at least one kind selected from the group of malonic acid, glutaric acid, maleic acid, fumaric acid, oxalic acid, succinic acid, adipic acid, malic acid, tartaric acid, and citric acid. As the organic solvent, cyclohexane, PGMEA (Propyleneglycol Monomethyl Ether Acetate), PGME (Propyleneglycol Monomethyl Ether), ethyl lactate, 2-heptanone, or the like can be used. In First Embodiment, a chemical solution A formed by dissolving toluenesulfonic acid in cyclohexane at a concentration of 5% by weight is used.

At the heat treatment HT1 in the organic acid pretreatment, the temperature T1 is set at 110° C. and the time t1 is set at 60 seconds or more for example. Through the heat treatment, ammonia/amines existing over the surface of the cap insulating film CAP comprising a silicon nitride film and nitrogen atoms constituting the film and having lone-pair electrons react with organic acid and thereby it is possible to: prevent the acid in the resist film PR2 from being inactivated; and prevent a development residue from being generated as described later.

Successively, hydrophobizing surface treatment (called HMDS treatment) is applied to the principal surface of the semiconductor wafer (semiconductor substrate 1S) in order to improve adhesiveness to the resist film PR2 (Step S33 in FIG. 23). Concretely, hydrophobicity is improved by exposing the semiconductor wafer to HMDS (hexamethyldisilazane) vapor and replacing the hydroxyl group of the silicon nitride film formed over the principal surface of the semiconductor wafer with a hydrocarbon group and not a film is deposited.

Successively, a resist film PR2a is applied over the principal surface of the semiconductor wafer (semiconductor substrate 1S) (Step S34 in FIG. 23). The resist film PR2a: is a positive type chemical amplification type resist; as described in Japanese Examined Patent Application Publication No. Hei2 (1990)-27660 for example, is based on a binary system resist having a base material resin formed by replacing a hydroxyl group of polyhydroxy styrene having a high transparency to KrF laser light with an acid-dissociative alkali dissolution inhibition group of such as a t-boc (tert-butoxycarbonyloxy) group and an acid generating agent as the main components; and is dissolved in an organic solvent such as PGMEA or the like. The chemical amplification resist is applied so as to touch the cap insulating film CAP comprising a silicon nitride film.

Successively, preexposure heat treatment HT2 is applied to the applied resist film PR2a (Step S35 in FIG. 23). The preexposure heat treatment HT2 is applied by setting the temperature T2 at 90° C. and the time t2 at 60 seconds for example in order to vaporize the organic solvent.

Figure 24:
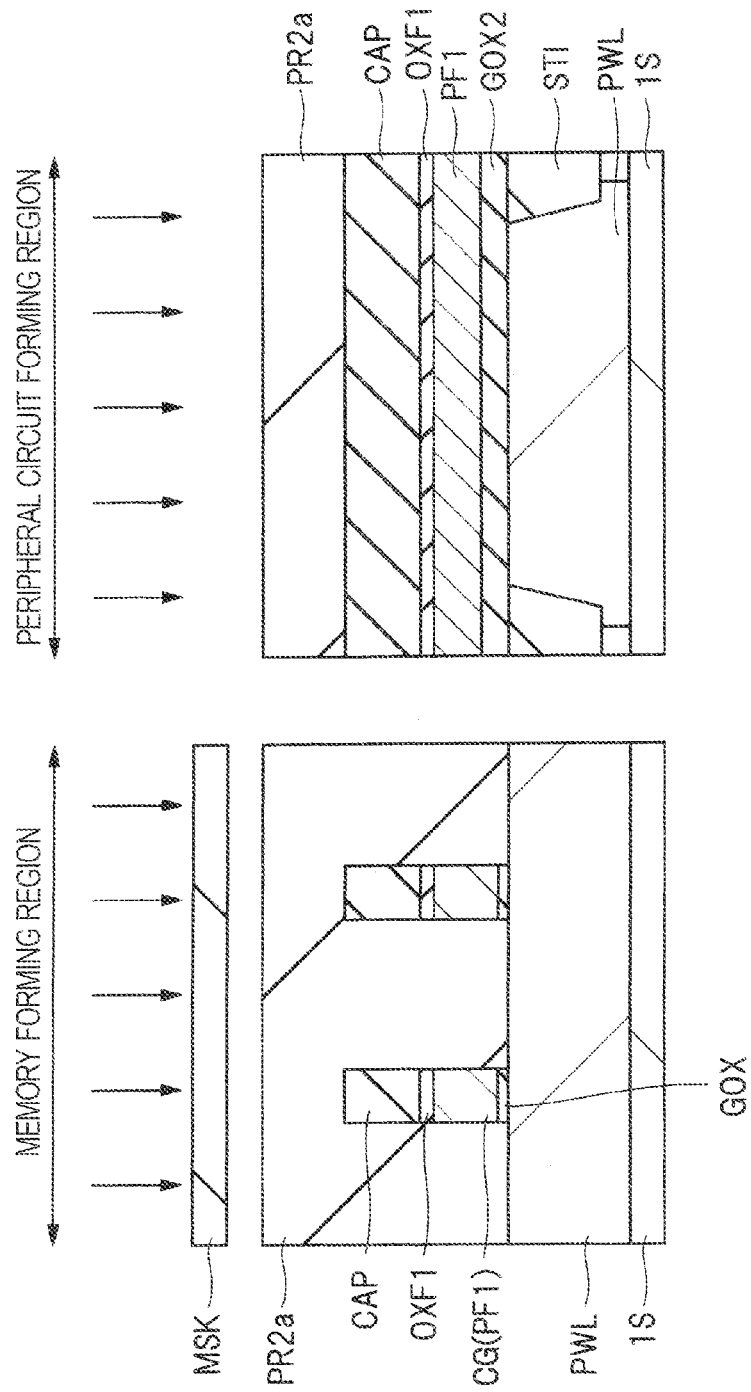
FIG. 24 is a sectional view of a semiconductor device during a manufacturing process according to First Embodiment.

Successively, an exposure process is applied (Step S36 in FIG. 23). FIG. 24 is a sectional view of a semiconductor device during a manufacturing process according to First Embodiment. Concretely, FIG. 24 is a sectional view at an exposure process. As shown in FIG. 24, at the exposure process, the mask pattern of a photomask MSK is transcribed to the resist film PR2a by ultraviolet light of KrF excimer laser. The photomask (reticle) MSK has a mask pattern to cover the memory cell forming region and expose the peripheral circuit forming region and the resist film PR2a in the peripheral circuit forming region is exposed. It is also possible to use ArF excimer laser in place of the KrF excimer laser. Here, as shown in FIG. 24, the resist film PR2a is formed over the cap insulating film CAP so as to touch the cap insulating film CAP. That is, an antireflection film or the like is not interposed between the cap insulating film CAP and the resist film PR2a.

Successively, postexposure heat treatment HT3 is applied to the semiconductor wafer (Step S37 in FIG. 23). The postexposure heat treatment HT3 is applied by setting the temperature T3 at 110° C. and the time t3 at 60 seconds for example. At the previously described disposure process, in the irradiated region irradiated with the ultraviolet light, acid is generated from an acid generating agent contained in the resist film PR2a. Further, by applying the postexposure heat treatment HT3, deprotection reaction advances at the resist film PR2a in the irradiated region. That is, the acid generated in the exposed region acts on and decomposes the acid-dissociative alkali dissolution inhibition group of the base material resin and changes the resist film PR2a to a molecular structure dissolvable in an alkaline developing solution.

Successively, a development process to apply development treatment to the semiconductor wafer is carried out (Step S38 in FIG. 23). As the developing solution, an alkaline tetramethylammonium hydroxide solution (hereunder referred to as TMAH solution) or the like is used. At the development treatment, the resist film PR2a in the exposed region is removed by the TMAH solution that is an alkaline developing solution. In this way, as shown in FIG. 7, the resist film PR2 having a pattern to cover the memory cell forming region and expose the peripheral circuit forming region is formed. Here, it is known that the TMAH solution contains metal impurities such as iron (Fe), chromium (Cr), and others. In First Embodiment, it is important to reduce the content of metal impurities in a developing solution and it is possible to reduce the number of defects per unit area by one digit by controlling the metal impurity content of each metal single body to 2 ppt by weight or lower for example.

From the resist coating process (Step S34) of FIG. 23 to the development treatment (Step S38) to the resist film PR2a constitutes the process of forming a resist mask comprising the resist film PR2.

Successively, the cap insulating film CAP is removed (Step S39 in FIG. 23). Anisotropic dry etching is applied to the semiconductor wafer with the resist film PR2 used as a mask and the cap insulating film CAP in the peripheral circuit forming region is removed. Further, the silicon oxide film OXF1 is also removed in succession to the cap insulating film CAP.

Successively, the resist film PR2 is removed and the process leads to the process of Step S8 in FIG. 3 explained in reference to FIG. 8.

<With Regard to Study Example>

Figure 25:
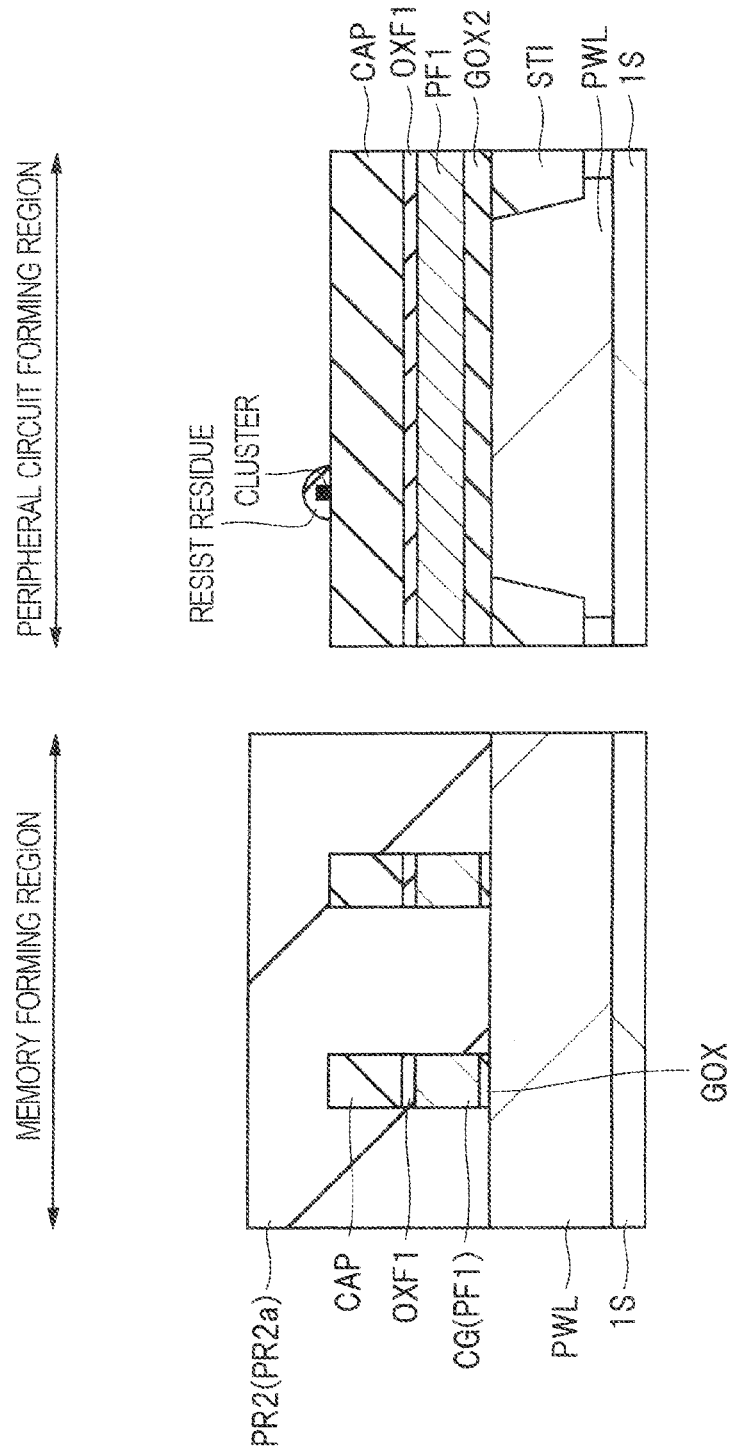
FIG. 25 is a sectional view of a semiconductor device during a manufacturing process according to a study example.
Figure 26:
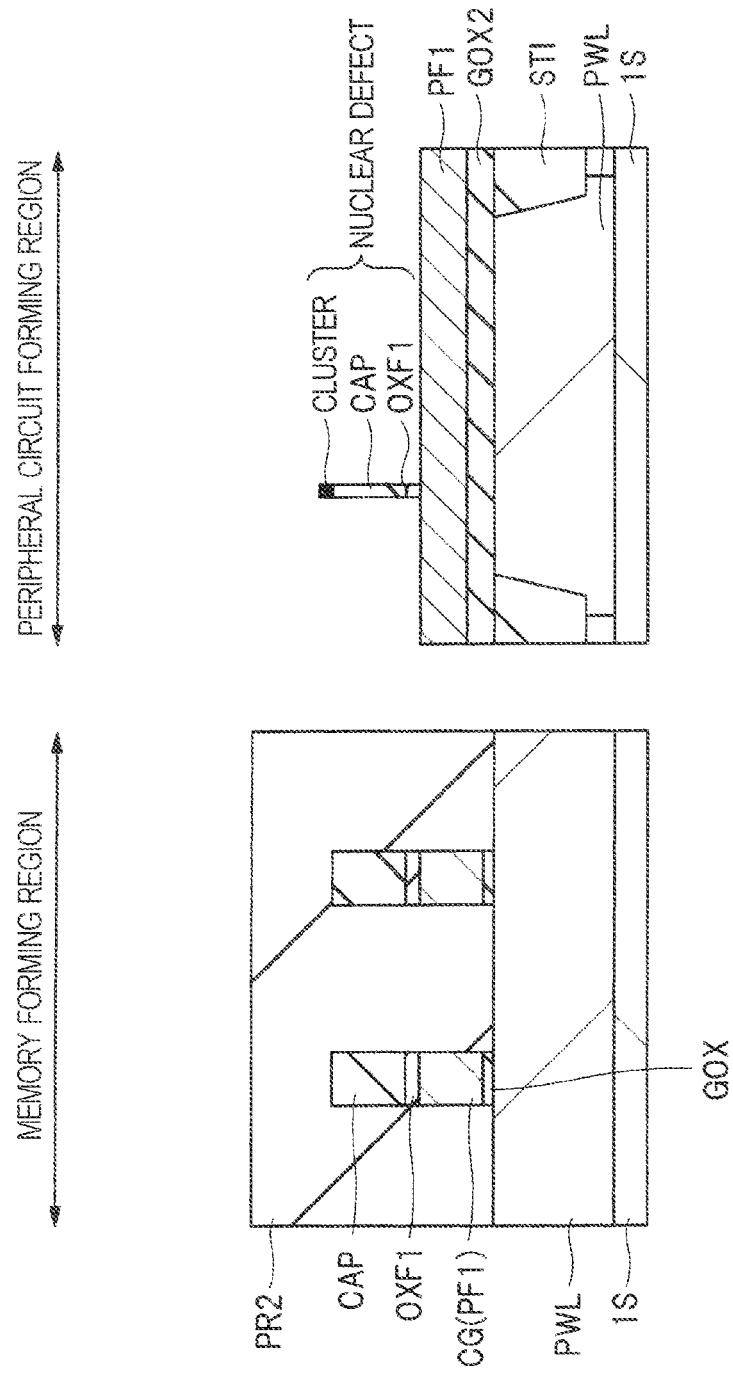
FIG. 26 is a sectional view of the semiconductor device during a manufacturing process succeeding to FIG. 25.
Figure 27:
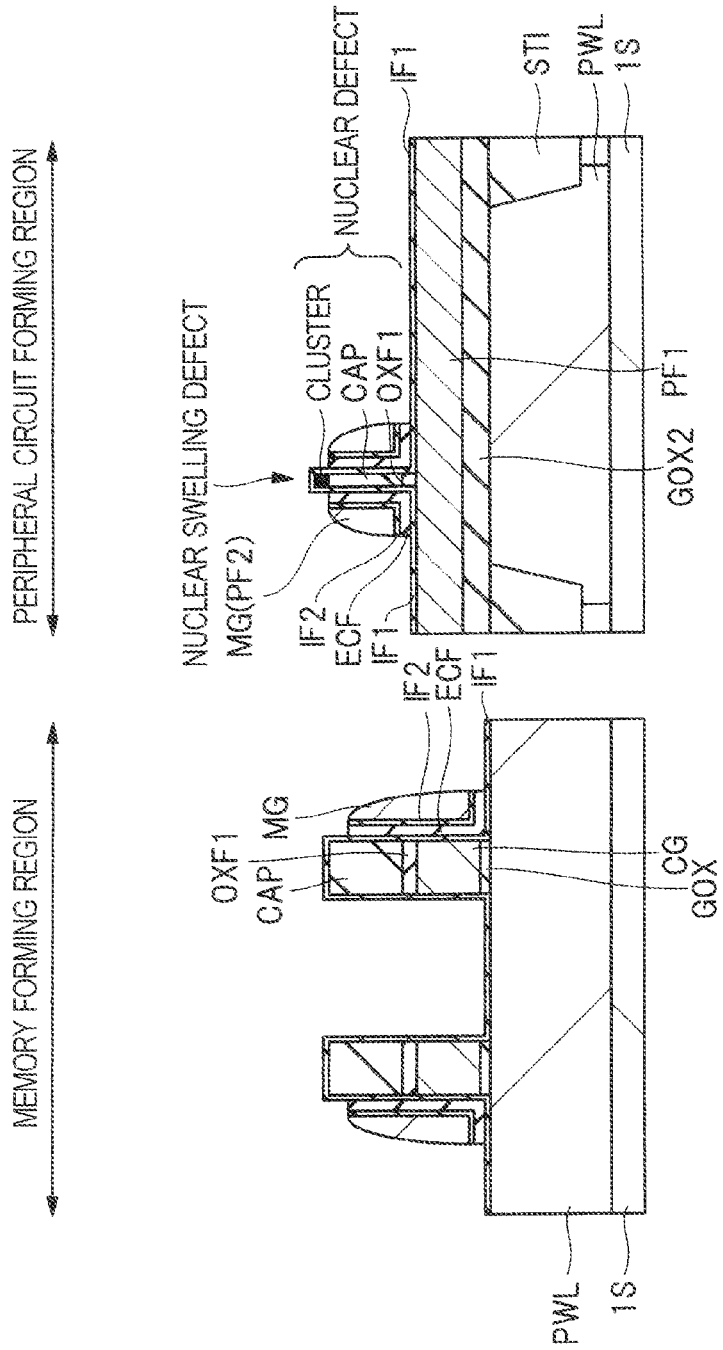
FIG. 27 is a sectional view of the semiconductor device during a manufacturing process succeeding to FIG. 26.

A manufacturing method of a semiconductor device that is a study example by the present inventors is explained hereunder. FIGS. 25 to 27 are sectional views of a semiconductor device during manufacturing processes according to a study example.

There are two different points between the study example and the process flow diagram in FIG. 23 and the other points are common. In the study example firstly, organic acid pretreatment (Step S32) is not applied and, in the study example secondly, a developing solution having a metal impurity concentration of 9 ppt by weight is used in the development treatment (Step S38).

FIG. 25 is a sectional view at the stage of finishing the development treatment (Step S38) in the process flow diagram of FIG. 23. FIG. 26 is a sectional view at the stage of finishing the process (Step S7) of removing the cap insulating film CAP and the silicon oxide film OXF1 in the process flow diagram of FIG. 3. Then FIG. 27 is a sectional view at the stage of finishing the process (Step S10) of removing the insulating film IF2 and the charge accumulation film ECF in the process flow diagram of FIG. 3.

The present inventors have confirmed the problem in that, in the case of the study example, as shown in FIG. 27, in the peripheral circuit forming region, a defect called "nuclear swelling defect" is formed over the polysilicon film PF1 and short circuit is caused between gate electrodes GE by the nuclear swelling defect at the stage of finishing the gate electrode GE forming process (Step S12) in FIG. 4. The reason of causing short circuit between gate electrodes, in other words the nuclear swelling defect, that has been clarified through the studies by the present inventors is explained hereunder.

Firstly, as shown in FIG. 25, at the stage of finishing the development treatment (Step S38 in FIG. 23), in the peripheral circuit forming region, a resist residue is recognized over the surface of the cap insulating film CAP. Then it is found that a cluster comprising an aggregate of metal atoms (iron (Fe) atoms for example) is formed in the resist residue. In the exposed region, the resist film PR2a comes to be soluble into an alkaline developing solution by generating acid in the resist film PR2a and advancing the deprotection reaction. In the case of the study example however, since the resist film PR2a is formed directly over the cap insulating film CAP comprising a silicon nitride film, acid is inactivated by the influence of ammonia/amine contained in the cap insulating film CAP or the nitrogen atoms constituting the film and having lone-pair electrons, the deprotection reaction is insufficient, and thus the resist residue is generated. Further, at the development process, metal atoms (iron (Fe) for example) contained in the developing solution are trapped in a polar group in the base material resin that is the material of the resist film PR2a that has come to the resist residue and a cluster comprising an aggregate of the metal atoms is formed. Then it has been clarified that the size of the cluster depends on the content of metal impurities in the developing solution.

Successively, FIG. 26 shows the state of finishing the process (Step S39 in FIG. 23) of removing the cap insulating film CAP and the silicon oxide film OXF1 (corresponding to FIG. 7). As shown in FIG. 26, in the peripheral circuit forming region, a defect (called "nuclear defect") comprising the silicon oxide film OXF1, the cap insulating film CAP, and the cluster is formed. The nuclear defect means an etching residue caused by a cluster. Normally the resist film PR2 should not remain in the peripheral circuit forming region and as shown in FIG. 7, the cap insulating film CAP and the silicon oxide film OXF1 should be removed and the polysilicon film PF1 should be exposed in the peripheral circuit forming region. As stated earlier however, the nuclear defect is formed undesirably by generating the resist residue containing the cluster over the surface of the cap insulating film CAP. The resist residue itself is removed at the dry etching process of the cap insulating film CAP but the cluster comprising metal atoms is not etched and remains and hence the nuclear defect that is a laminated body of the silicon oxide film OXF1, the cap insulating film CAP, and the cluster remains undesirably.

If such a nuclear defect remains, the nuclear defect itself comes to be a foreign substance and causes the yield to lower at the manufacturing process of a semiconductor device. Further, because of the nuclear defect, there is a problem in that, at the stage of finishing the gate electrode GE forming process (Step S12) in FIG. 4, an etching residue of the polysilicon film PF1 is generated, short circuit is caused between gate electrodes GE, and hence the yield lowers. Furthermore, another problem is that short circuit is caused between gate electrodes GE in a plurality of MISFETs formed in the peripheral circuit forming region and the reliability of a semiconductor device lowers.

Further, the problems come to be more serious in the case of a semiconductor device incorporating a nonvolatile memory. FIG. 27 shows the state of finishing the process (Step S10 in FIG. 3) of removing the insulating film IF2 and the charge accumulation film ECF (corresponding to FIG. 10). As shown in FIG. 27, in the peripheral circuit forming region, a nuclear swelling defect formed by stacking the insulating film IF1, the charge accumulation film ECF, the insulating film IF2, and the polysilicon film PF2 over the circumference (sidewall) of the nuclear defect remains. The nuclear defect comprising the laminated body of the silicon oxide film OXF1, the cap insulating film CAP, and the cluster shown in FIG. 26 corresponds to the laminated structure comprising the gate insulating film GOX, the control gate electrode CG, the silicon oxide film OXF1, and the cap insulating film CAP in the memory cell forming region in FIG. 8 and hence, by passing through the processes of Step S8 to Step S10 in FIG. 3, a nuclear swelling defect of a structure similar to a memory cell is formed also in the peripheral circuit forming region as shown in FIG. 27. Then because of the nuclear swelling defect, at the stage of finishing the gate electrode GE forming process (Step S12) in FIG. 4, the etching residue of the polysilicon film PF1 is generated and short circuit between gate electrodes GE is caused undesirably. A problem here is that the area of the nuclear swelling defect is about 10 times the area of the nuclear defect, hence the incidence of the short circuit between gate electrodes GE caused by the nuclear defect increases 10 times, and the yield lowers further. Further, another problem is that the reliability of a semiconductor device lowers.

According to the point of view by the present inventors, in order to prevent or reduce a nuclear swelling defect in the manufacturing method of a semiconductor device according to the study example, it is important to: prevent a resist residue from being generated; and/or reduce the content of metal impurities in a developing solution.

<With Regard to the Main Features and Effects of First Embodiment>

The main features and effects of the present embodiment are explained hereunder.

In the manufacturing method of a semiconductor device according to First Embodiment, when a resist mask comprising a chemical amplification type resist is formed over a silicon nitride film so as to touch the silicon nitride film and etching is applied to the silicon nitride film with the resist mask used, organic acid pretreatment is applied to the surface of the silicon nitride film before the resist mask comprising the chemical amplification type resist is formed.

As a result, even when the chemical amplification type resist is formed directly over (so as to touch) the surface of the silicon nitride film, it is possible to: prevent or reduce the phenomenon that acid in the chemical amplification type resist is inactivated and the deprotection reaction finishes insufficiently in an exposed region; and hence prevent or reduce the generation of a resist residue. That is, since the deprotection reaction of the chemical amplification type resist is not hindered by the organic acid pretreatment in the exposed region, it is possible to prevent or reduce the generation of the resist residue.

Further, since it is possible to prevent or reduce the generation of a resist residue by pretreating the surface of the silicon nitride film with organic acid, it is possible to prevent or reduce the generation of a nuclear defect caused by a cluster contained in the resist residue.

Furthermore, since it is possible to prevent or reduce the generation of a resist residue and prevent or reduce the generation of a nuclear defect caused by a cluster contained in the resist residue by pretreating the surface of the silicon nitride film with organic acid, it is possible to prevent or reduce the generation of a nuclear swelling defect caused at the manufacturing process of a semiconductor device having a nonvolatile memory.

It is therefore possible to improve the manufacturing yield of a semiconductor device. Further, since it is possible to prevent a defect, it is possible to improve the reliability of a semiconductor device.

In the manufacturing method of a semiconductor device according to First Embodiment, when a resist mask comprising a chemical amplification type resist is formed over a silicon nitride film so as to touch the silicon nitride film and etching is applied to the silicon nitride film with the resist mask used, organic acid pretreatment is applied to the surface of the silicon nitride film before the resist mask comprising the chemical amplification type resist is formed and further the metal content of each metal single body in a developing solution used for the development treatment of the chemical amplification type resist is controlled to 2 ppt by weight or less.

By controlling the metal content of each metal single body in a developing solution to 2 ppt by weight or less, even when a resist residue is generated for the time being, the metal content in the developing solution is small and hence it is possible to reduce the number of metal atoms trapped in the resist residue. By reducing the quantity of metals contained in the resist residue, it is possible to inhibit the resist residue from being transcribed to the base film during etching.

Modified Example

A modified example of organic acid pretreatment in First Embodiment is explained hereunder. The part other than the organic acid pretreatment is the same as First Embodiment.

Although the example of organic acid pretreatment by the chemical solution A formed by mixing an organic acid and an organic solvent has been explained in First Embodiment, a chemical solution B formed by adding and mixing a macromolecular organic compound dissolving in a thinner to the chemical solution A is used in the modified example. The organic acid and the organic solvent in the chemical solution B are the same as First Embodiment. Further, the heat treatment applied after the chemical solution B is spread over the principal surface of a semiconductor wafer (semiconductor substrate 1S) is also the same as First Embodiment.

As the macromolecular organic compound of the modified example, a novolak resin can be used for example. In the case of the modified example, the viscosity of the chemical solution B can be higher than that of the chemical solution A and hence it is possible to uniformly spread the chemical solution B over the principal surface of the semiconductor wafer as a coated film and reduce the variation of the organic acid pretreatment over the surface of the semiconductor wafer. In the case of the modified example however, it is necessary to dissolve and remove the macromolecular organic compound by a thinner such as butyl acetate or the like after heat treatment.

That is, in the organic acid pretreatment in the case of the modified example, after the chemical solution B prepared by mixing an organic acid, a macromolecular organic compound, and an organic solvent is supplied to the principal surface of a silicon nitride film, heat treatment is applied to a semiconductor wafer and successively the macromolecular organic compound is removed by butyl acetate or the like.

Second Embodiment

Figure 28:
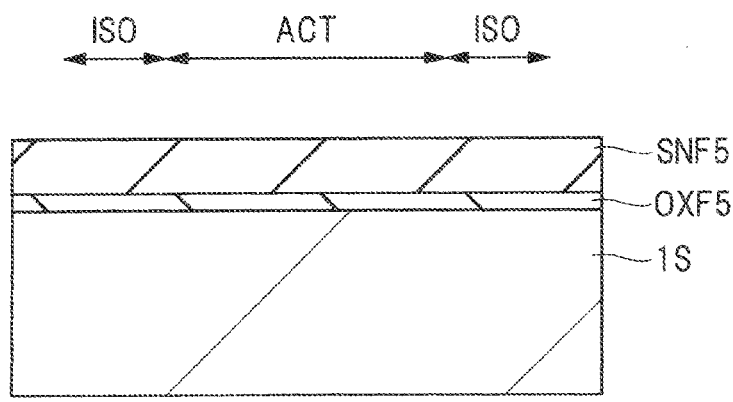
FIG. 28 is a sectional view of a semiconductor device during a manufacturing process according to Second Embodiment.

Second Embodiment shows a process of forming an element isolation film STI in a peripheral circuit forming region of a semiconductor device according to First Embodiment. FIGS. 28 to 32 are sectional views of a semiconductor device during manufacturing processes according to Second Embodiment. FIGS. 28 to 32 correspond to the processes of Step S1 and Step S2 in FIG. 3 according to First Embodiment. For example, as shown in FIG. 28, an active region ACT and an element isolation region ISO are installed in a semiconductor substrate 1S, an element isolation film STI is formed in the element isolation region ISO, and a high withstand voltage MISFET is formed in the active region ACT.

FIG. 28 shows a process of forming a silicon oxide film OXF5 and a silicon nitride film SNF5. The silicon oxide film OXF5 having a film thickness of about 10 to 20 nm is formed over the principal surface of a semiconductor substrate 1S by a thermal oxidation method. Successively, the silicon nitride film SNF5 having a film thickness of about 170 to 200 nm is formed by a plasma CVD method for example.

Figure 29:
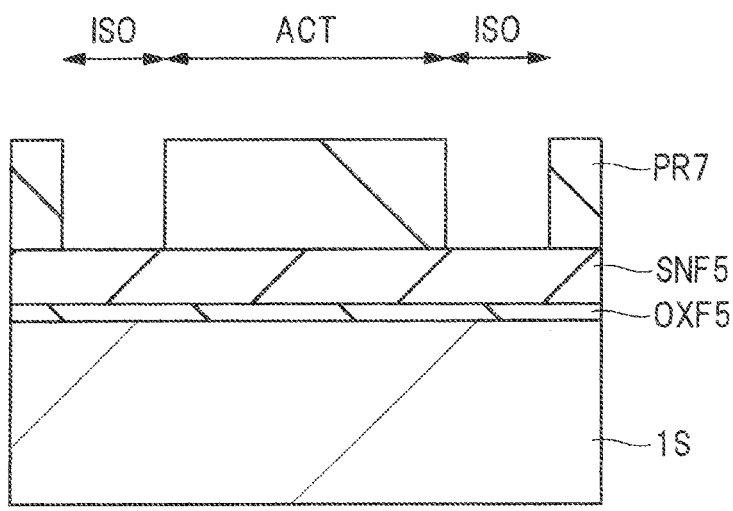
FIG. 29 is a sectional view of the semiconductor device during a manufacturing process succeeding to FIG. 28.

FIG. 29 shows a process of forming a resist film (resist mask) PR7. The resist film PR7 is formed over the principal surface of the silicon nitride film SNF5 so as to touch the principal surface of the silicon nitride film SNF5. The resist film PR7 has a pattern to cover the active region ACT and expose the element isolation region ISO. In forming the resist film PR7, Step S32 to Step S38 in FIG. 23 according to First Embodiment are applied and the method is the same as First Embodiment. A chemical amplification type resist is formed (applied) so as to directly touch the principal surface of the silicon nitride film SNF5. Here, it is also possible to apply cleaning treatment to the principal surface of the silicon nitride film SNF5 in advance of the organic acid pretreatment of Step S32 in FIG. 23. On this occasion, pure water cleaning is desirable for example. Further, it is also possible to apply the modified example as the organic acid pretreatment.

Figure 30:
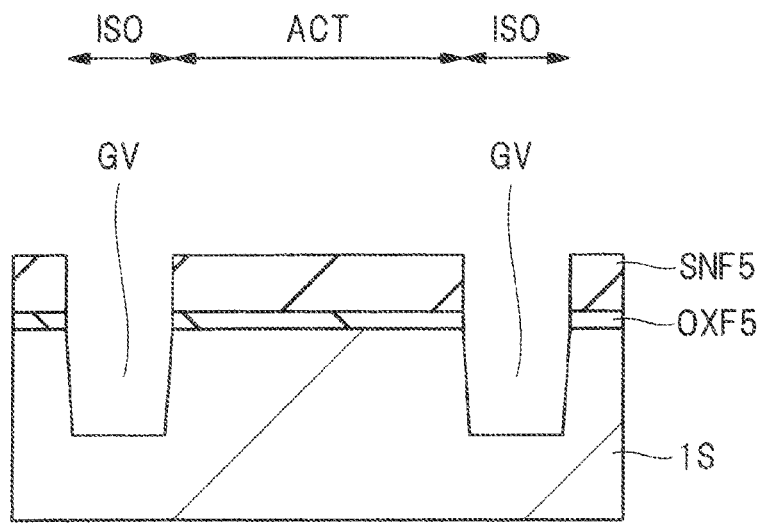
FIG. 30 is a sectional view of the semiconductor device during a manufacturing process succeeding to FIG. 29.

FIG. 30 shows a process of etching the silicon nitride film SNF5 and a process of forming an element isolation trench GV. Firstly, anisotropic dry etching is applied to the silicon nitride film SNF5 with the resist mask PR7 used and the silicon nitride film SNF5 is patterned. That is, the silicon nitride film SNF5 in the element isolation region ISO is removed. Successively, the silicon oxide film OXF5 in the element isolation region ISO is removed with the silicon nitride film SNF5 remaining in the active region ACT used as a mask and the element isolation trench GV is formed in the semiconductor substrate 1S in the element isolation region ISO.

Figure 31:
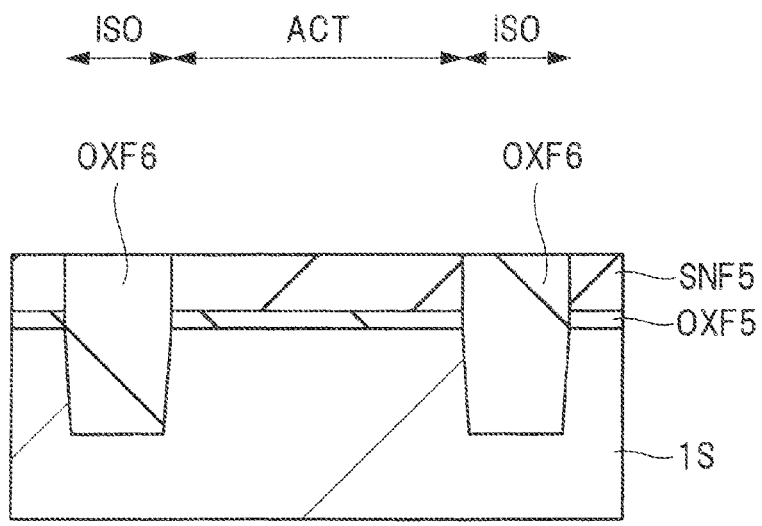
FIG. 31 is a sectional view of the semiconductor device during a manufacturing process succeeding to FIG. 30.

FIG. 31 shows a process of polishing an insulating film OXF6. An insulating film OXF6 comprising a silicon oxide film of such a film thickness as to completely fill the element isolation trench GV is formed in the element isolation trench GV. Successively, the insulating film OXF6 is polished by a CMP method with the silicon nitride film SNF5 used as a stopper, thus the insulating film OXF6 over the silicon nitride film SNF5 is removed, and the insulating film OXF6 remains selectively in the element isolation region ISO.

Figure 32:
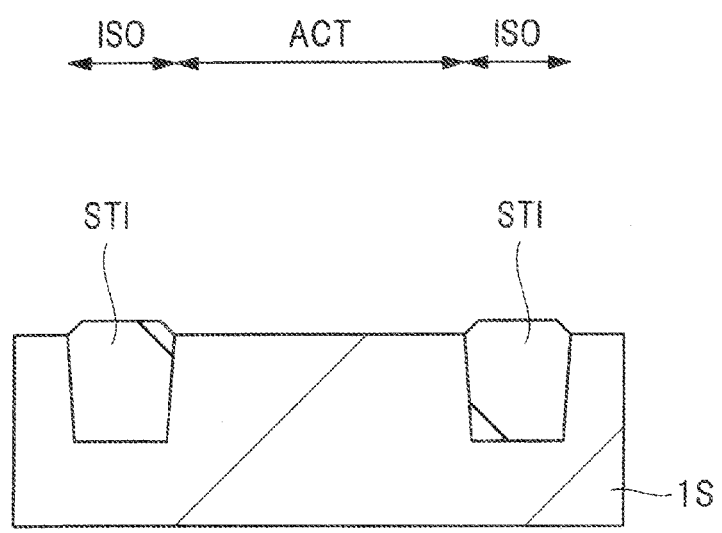
FIG. 32 is a sectional view of the semiconductor device during a manufacturing process succeeding to FIG. 31.

FIG. 32 shows a process of forming an element isolation film STI. By removing the silicon nitride film SNF5 and the silicon oxide film OXF5 formed in the active region ACT by wet etching, the element isolation film STI is formed selectively in the element isolation region ISO.

According to Second Embodiment, even when a silicon nitride film is patterned with a resist mask comprising a chemical amplification type resist used, since organic acid pretreatment is applied to the principal surface of the silicon nitride film SNF5 before the chemical amplification type resist is applied, it is possible to reduce a resist residue and a nuclear defect and improve the yield at the manufacturing process of a semiconductor device.

Although the invention established by the present inventors has heretofore been explained concretely on the basis of the embodiments, it goes without saying that the present invention is not limited to the embodiments and can be modified variously within the scope not departing from the tenor of the present invention.

What is claimed is:

1. A manufacturing method of a semiconductor device, comprising the processes of:
   (a) forming a silicon nitride film over a semiconductor substrate;
   (b) applying organic acid treatment to a principal surface of the silicon nitride film;
   (c) forming a resist mask having a prescribed pattern over the principal surface of the silicon nitride film by using a chemical amplification resist; and
   (d) applying etching treatment to the silicon nitride film by using the resist mask,
   wherein the resist mask is formed so as to touch the principal surface of the silicon nitride film,
   the process (c) includes the processes of (c-1) applying the chemical amplification-resist to the principal surface of the silicon nitride film, (c-2) irradiating the chemical amplification resist partially with ultraviolet light for exposure, and (c-3) removing the light irradiated part irradiated with the ultraviolet light of the chemical amplification resist by a developing solution, and
   a metal content of each metal single body contained in the developing solution is 2 ppt by weight or less.

2. The manufacturing method of a semiconductor device according to claim 1,
   wherein the ultraviolet light is KrF excimer laser light or ArF excimer laser light.

3. The manufacturing method of a semiconductor device according to claim 1,
   wherein the manufacturing method further includes the process of (e) applying HMDS treatment to the principal surface of the silicon nitride film between the processes (b) and (c).

4. The manufacturing method of a semiconductor device according to claim 1,
   wherein the process (b) includes the processes of (b-1) supplying a first chemical solution prepared by mixing a first organic acid and a first organic solvent to the principal surface of the silicon nitride film and (b-2) applying first heat treatment to the semiconductor substrate.

5. The manufacturing method of a semiconductor device according to claim 1,
   wherein the process (b) includes the processes of (b-3) supplying a second chemical solution prepared by mixing a second organic acid, a macromolecular organic compound, and a second organic solvent to the principal surface of the silicon nitride film, (b-4) applying second heat treatment to the semiconductor substrate, and (b-5) removing the macromolecular organic compound by a thinner.

6. The manufacturing method of a semiconductor device according to claim 1,
wherein the manufacturing method further includes the process of (f) subjecting the principal surface of the silicon nitride film to SPM cleaning, APM cleaning, DFM cleaning, HPM cleaning, or pure water cleaning between the processes (a) and (b).

7. The manufacturing method of a semiconductor device according to claim 1,
wherein the process (c) further includes the process of (c-4) applying third heat treatment to the semiconductor substrate in order to advance deprotection reaction at the light irradiated part of the chemical amplification resist between the processes (c-2) and (c-3).

8. The manufacturing method of a semiconductor device according to claim 1,
wherein the etching treatment is anisotropic dry etching.

9. A manufacturing method of a semiconductor device having a nonvolatile memory cell having a control gate electrode and a memory gate electrode in a memory cell forming region and a MISFET having a gate electrode in a peripheral circuit forming region,
wherein:
the manufacturing method includes the processes of:
(a) forming a first polysilicon film over a semiconductor substrate having the memory cell forming region and the peripheral circuit forming region and a first silicon nitride film having a principal surface over the first polysilicon film;
(b) forming the control gate electrode in the memory cell forming region by patterning the first silicon nitride film and the first polysilicon film in the memory cell forming region in the state of covering the peripheral circuit forming region with a first resist mask;
(c) applying organic acid treatment to the principal surface of the first silicon nitride film in the memory cell forming region and the peripheral circuit forming region;
(d) forming a second resist mask to cover the memory cell forming region and expose the peripheral circuit forming region over the principal surface of the first silicon nitride film by using a chemical amplification resist;
(e) applying first anisotropic dry etching treatment to the first silicon nitride film in the peripheral circuit forming region by using the second resist mask and removing the first silicon nitride film in the peripheral circuit forming region;
(f) after forming a first silicon oxide film, a second silicon nitride film, a second silicon oxide film, and a second polysilicon film in sequence in the memory cell forming region and the peripheral circuit forming region, applying second anisotropic dry etching treatment to the second polysilicon film, forming the memory gate electrode over the sidewall of the control gate electrode in the memory cell forming region, and removing the second polysilicon film in the peripheral circuit forming region;
(g) removing the second silicon oxide film and the second silicon nitride film in a region not covered with the control gate electrode in the memory cell forming region and removing the second silicon oxide film and the second silicon nitride film in the peripheral circuit forming region; and
(h) applying third anisotropic dry etching to the first polysilicon film by using a third resist mask to cover the memory cell forming region and forming the gate electrode in the peripheral circuit forming region,
the resist mask is formed so as to touch the principal surface of the first silicon nitride film,
the process (d) includes the processes of (d-1) applying the chemical amplification resist over the principal surface of the first silicon nitride film, (d-2) irradiating the chemical amplification resist partially with ultraviolet light for exposure, (d-3) applying first heat treatment to the semiconductor substrate in order to advance deprotection reaction at the light irradiated part of the chemical amplification resist, and (d-4) removing the light irradiated part irradiated with the ultraviolet light of the chemical amplification resist by a developing solution, and
a metal content of each metal single body contained in the developing solution is 2 ppt by weight or less.

10. A manufacturing method of a semiconductor device according to claim 9,
wherein the process (c) includes the processes of (c-1) supplying a first chemical solution prepared by mixing a first organic acid and a first organic solvent to the principal surface of the first silicon nitride film and (c-2) applying second heat treatment to the semiconductor substrate.

11. A manufacturing method of a semiconductor device according to claim 9,
wherein the process (c) includes the processes of (c-3) supplying a second chemical solution prepared by mixing a second organic acid, a macromolecular organic compound, and a second organic solvent to the principal surface of the first silicon nitride film, (c-4) applying third heat treatment to the semiconductor substrate, and (c-5) removing the macromolecular organic compound by a thinner.

12. A manufacturing method of a semiconductor device, comprising the processes of:
(a) forming a silicon nitride film having a second principal surface over a first principal surface of a semiconductor substrate having an active region and an element isolation region;
(b) applying organic acid treatment to the second principal surface of the silicon nitride film;
(c) forming a resist mask to cover the active region and expose the element isolation region over the second principal surface of the silicon nitride film by using a chemical amplification resist;
(d) applying first dry etching treatment to the silicon nitride film by using the resist mask and removing the silicon nitride film in the element isolation region;
(e) applying second dry etching treatment to the semiconductor substrate and forming a trench in the depth direction from the first principal surface of the semiconductor substrate in the element isolation region;
(f) forming an insulating film in the interior of the trench and over the silicon nitride film in the active region so as to fill the trench;
(g) applying CMP treatment to the insulating film and selectively leaving the insulating film in the trench; and
(h) after removing the silicon nitride film in the active region, forming a MISFET in the active region, and
wherein the resist mask is formed so as to touch the second principal surface of the silicon nitride film, wherein the process (c) includes the processes of (c-1) applying the chemical amplification resist to the second principal surface of the silicon nitride film, (c-2) irradiating the chemical amplification resist partially with ultraviolet light for exposure, (c-3) applying first heat treatment to the semiconductor substrate in order to advance deprotection reaction at the light irradiated part of the chemical amplification resist, and (c-4) removing the light irradiated part irradiated with the ultraviolet light of the chemical amplification resist by a developing solution, and a metal content of each metal single body contained in the developing solution is 2 ppt by weight or less.

13. The manufacturing method of a semiconductor device according to claim 12,
wherein the process (b) includes the processes of (b-1) supplying a first chemical solution prepared by mixing a first organic acid and a first organic solvent to the second principal surface of the silicon nitride film and (b-2) applying second heat treatment to the semiconductor substrate.

14. The manufacturing method of a semiconductor device according to claim 12,
wherein the process (b) includes the processes of (b-3) supplying a second chemical solution prepared by mixing a second organic acid, a macromolecular organic compound, and a second organic solvent to the second principal surface of the silicon nitride film, (b-4) applying third heat treatment to the semiconductor substrate, and (b-5) removing the macromolecular organic compound by a thinner.

* * * * *